US007642650B2

(12) United States Patent
Sugiura et al.

(10) Patent No.: US 7,642,650 B2
(45) Date of Patent: Jan. 5, 2010

(54) SEMICONDUCTOR DEVICE HAVING A PILLAR STRUCTURE

(75) Inventors: Iwao Sugiura, Kawasaki (JP); Takahisa Namiki, Kawasaki (JP); Yoshihiro Matsuoka, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 10/780,701

(22) Filed: Feb. 19, 2004

(65) Prior Publication Data

US 2004/0164418 A1 Aug. 26, 2004

(30) Foreign Application Priority Data

| Feb. 25, 2003 | (JP) | ................. 2003-047768 |
| Jul. 25, 2003 | (JP) | ................. 2003-280004 |

(51) Int. Cl.
*H01L 23/52* (2006.01)
(52) U.S. Cl. .................. 257/758; 257/759; 257/773
(58) Field of Classification Search ............... 257/758, 257/759, 773
See application file for complete search history.

(56) References Cited

U.S. PATENT DOCUMENTS

| 6,037,668 | A | 3/2000 | Cave et al. | |
| 6,605,873 | B1 * | 8/2003 | Vigna et al. | ............ 257/758 |
| 6,670,710 | B2 * | 12/2003 | Matsunaga | ............ 257/758 |
| 6,815,328 | B2 * | 11/2004 | Pio | ............ 438/618 |
| 6,870,265 | B2 * | 3/2005 | Kurimoto et al. | ............ 257/758 |
| 2002/0005584 | A1 * | 1/2002 | Domae | ............ 257/758 |
| 2002/0040986 | A1 * | 4/2002 | Sugiyama et al. | ............ 257/211 |
| 2003/0230809 | A1 * | 12/2003 | Nakajima et al. | ............ 257/758 |

FOREIGN PATENT DOCUMENTS

JP 2001-53148 2/2001

* cited by examiner

*Primary Examiner*—Matthew E Warren
(74) *Attorney, Agent, or Firm*—Westerman, Hattori, Daniels & Adrian, LLP

(57) ABSTRACT

A semiconductor device includes a first multilayer interconnection structure formed on a substrate and a second multilayer interconnection structure formed on the first multilayer interconnection structure, wherein the first multilayer interconnection structure includes a pillar extending from a surface of the substrate and reaching at least the second multilayer interconnection structure.

19 Claims, 21 Drawing Sheets

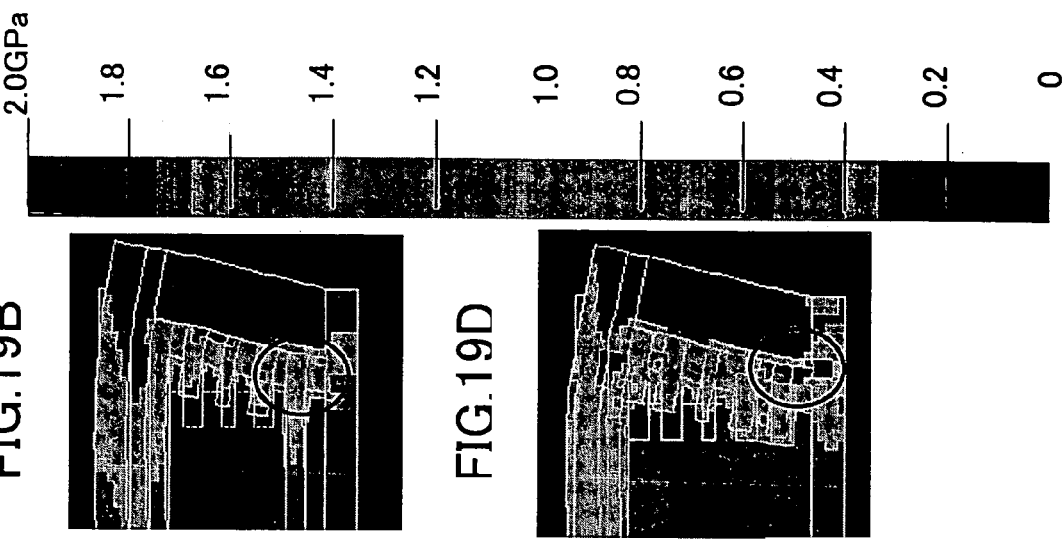
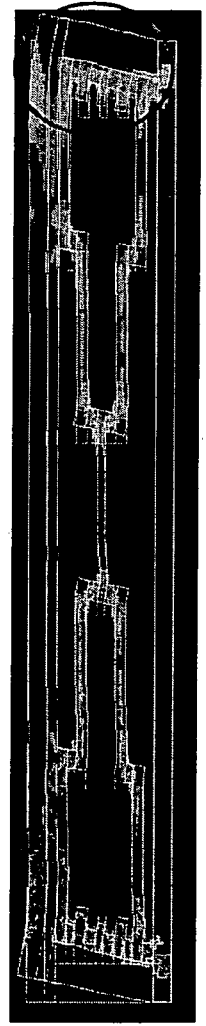
FIG.19A
FIG.19B
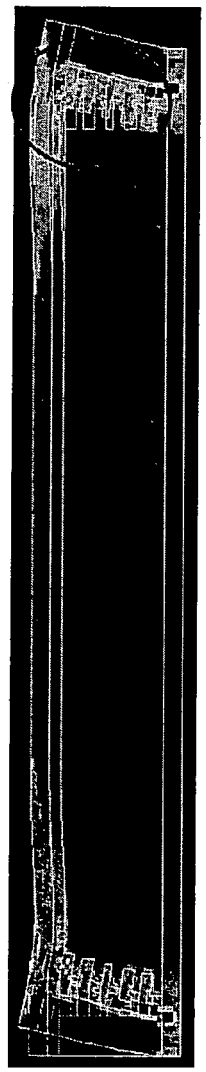
FIG.19C
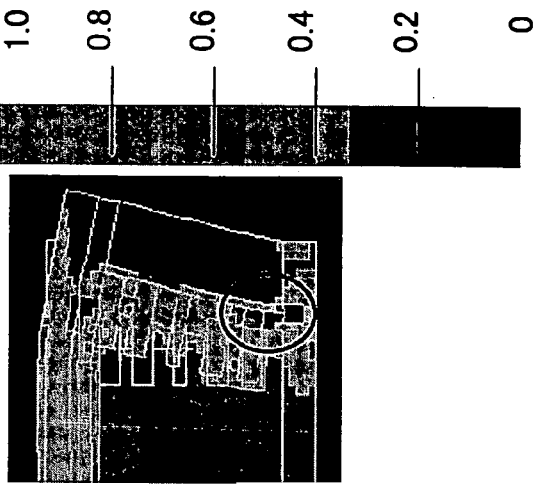
FIG.19D

SEMICONDUCTOR DEVICE HAVING A PILLAR STRUCTURE

CROSS-REFERENCE TO RELATED APPLICATION

The present application is based on Japanese priority applications No. 2003-047768 and No. 2003-280004 filed respectively on Feb. 25, 2003 and Jul. 25, 2003, the entire contents of which are hereby incorporated by reference.

BACKGROUND OF THE INVENTION

The present invention generally relates to semiconductor devices and more particularly to a semiconductor device having a multilayer interconnection structure.

Conventionally, increase of operational speed of semiconductor devices is attempted by way of miniaturizing the semiconductor devices according to so-called scaling law.

Meanwhile, in recent high-density semiconductor integrated circuits, a multilayer interconnection structure is used commonly for interconnecting individual semiconductor devices included in the integrated circuit.

In such a multilayer interconnection structure, the separation between adjacent interconnection patterns is reduced inside the multilayer interconnection structure as a result of device miniaturization, and there arises the problem of signal delay caused by parasitic capacitance formed between the interconnection patterns, particularly in the case of recent, highly miniaturized advanced semiconductor integrated circuits.

Thus, intensive investigations have been made for reducing the problem of signal delay caused by the multilayer interconnection structure, by using a low-dielectric constant film (so-called low-K film) such as an organic insulation film of hydrocarbon system or fluorocarbon system for the insulation film used for the interlayer insulation film of the multilayer interconnection structure, in place of using the conventional interlayer insulation film of the $SiO_2$ system, and further by using a low resistance conductor such as copper (Cu) for the interconnection pattern, in place of conventional Al.

Such an organic insulation film generally has a dielectric constant of 2.3-2.5, while it should be noted that this value is lower than the dielectric constant of a conventional $SiO_2$ interlayer insulation film by 40-50% or more.

A low dielectric constant film generally has a small density, and because of this, there is a tendency of having problems such as poor adhesion to interconnection pattern, poor resistance to humidity, and the like associated with the use of the low-dielectric interlayer insulation film.

SUMMARY OF THE INVENTION

According to a first aspect of the present invention, there is provided a semiconductor device, comprising:
a substrate;
a first multilayer interconnection structure formed on said substrate; and
a second multilayer interconnection structure formed on said first multilayer interconnection structure,
said first multilayer interconnection structure comprising a first interlayer insulation film and a first interconnection layer included in said first interlayer insulation film,
said second multilayer interconnection structure comprising a second interlayer insulation film and a second interconnection layer included in said second interlayer insulation film,
said first multilayer interconnection structure including a pillar at least reaching said second multilayer interconnection structure from a surface of said substrate,
said first interconnection layer being formed so as to avoid said pillar.

According to the present invention, it becomes possible to avoid the application of stress, in a semiconductor device having a structure in which a first multilayer interconnection structure and a second multilayer interconnection structure are stacked on a substrate, and in which the first multilayer interconnection structure using a low dielectric interlayer insulation film having a specific dielectric constant of typically 3.0 or less and Young modulus of 30 GPa or less and the second multilayer interconnection structure using an interlayer insulation film having a specific dielectric constant of 3.0 or more and Young modulus of 30 GPa or more, in such a manner that the stress to the minute interconnection pattern provided in the first multilayer interconnection structure at the time of wire bonding, and the like, is minimized, by forming a pillar at least in the first multilayer interconnection structure. With this construction, deformation or disconnection of minute interconnection patterns in the multilayer interconnection structure is successfully avoided.

According to another aspect of the present invention, there is provided a multilayer interconnection structure and a semiconductor device having such a multilayer interconnection structure, said multilayer interconnection structure comprising: at least two interconnection layers stacked via an intervening via-layer, each of said interconnection layers comprising an interlayer insulation film and an interconnection pattern formed in said interlayer insulation film,
said via-layer comprising a via-interlayer insulation film and a via-plug formed in said via-interlayer insulation film,
said via-plug connecting an interconnection pattern of said interconnection layer located on said via-layer and said interconnection pattern in said interconnection layer located underneath said via-layer,
said interlayer insulation film constituting said via-layer having a smaller film thickness and a larger elastic modulus as compared with said interlayer insulation film constituting said interconnection layer on and under said via-layer.

According to the present invention, it becomes possible to avoid the problem of concentration of stress in the multilayer interconnection structure that uses a low dielectric interlayer insulation film, by using an insulation film having a larger elastic modulus than the low dielectric interlayer insulation film and having a film thickness smaller than the film thickness of the low dielectric interlayer insulation film for the via-layer.

According to a further aspect of the present invention, there is provided a semiconductor device, comprising:
a substrate; and
a multilayer interconnection structure formed on said substrate, said multilayer interconnection structure including a plurality of pillars provided so as to reach a surface of said substrate,
said multilayer interconnection structure further including a diagonal reinforcement structure between said plural pillars.

According to the present invention, it becomes possible to improve the endurance of the semiconductor device against external stress by forming a plurality of pillars in the low dielectric constant multilayer interconnection structure formed on the substrate so as to reach the substrate surface and by further forming the reinforcement structure in a diagonal state between the plural pillars.

Other objects and further features of the present invention will become apparent from the following detailed description when read in conjunction with the attached drawings.

BRIEF DESCRIPTION OF THE DRAWINGS

FIGS. 19A-19D are diagrams showing the stress distribution in the multilayer interconnection structure of FIG. 18 together with the result for a comparative example;

DETAILED DESCRIPTION OF THE INVENTION

Because of the situation noted before, the use of the low-dielectric interlayer insulation film and low-resistance Cu interconnection pattern is limited to the lower layer part of the multilayer interconnection structure where ultrafine interconnection patterns are formed and hence the problem of signal delay becomes conspicuous. On the other hand, there is a desire to use the conventional $SiO_2$ interlayer insulation films having excellent adhesion for the upper layer part of the multilayer interconnection structure where the interconnection patterns are formed with relatively sparse interval.

Figure 1:
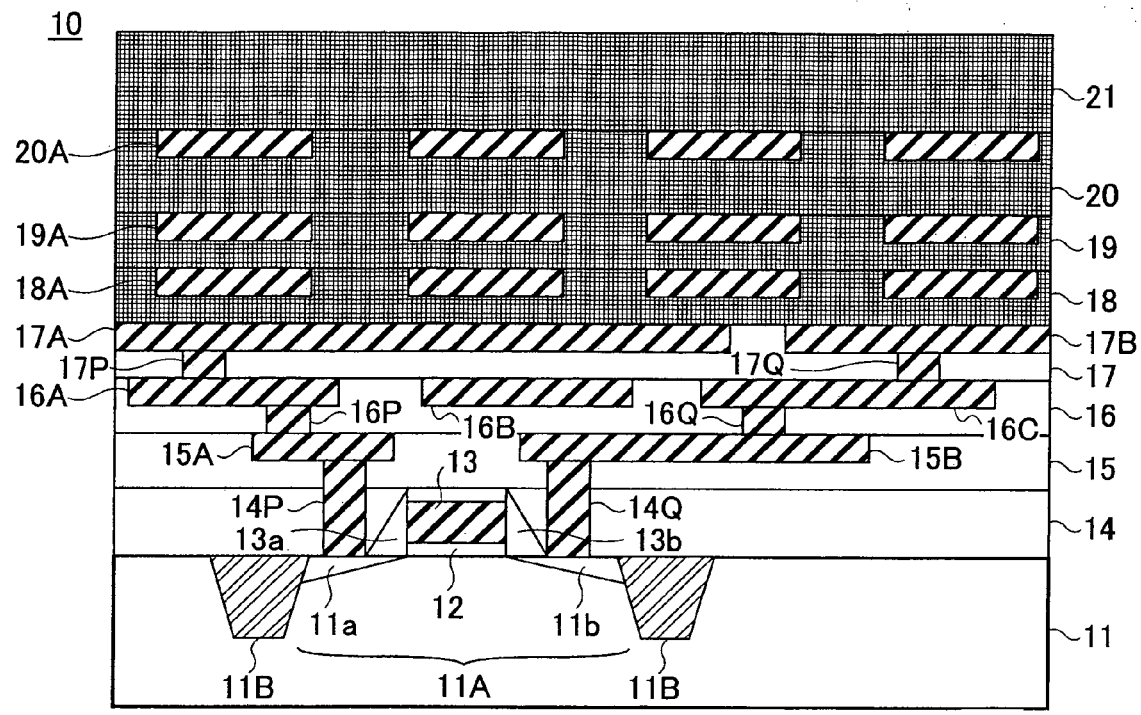
FIG. 1 is a diagram showing the construction of a semiconductor integrated circuit having a multilayer interconnection structure according to a related art.

FIG. 1 shows the construction of a semiconductor device 10 having a multilayer interconnection structure according to a related art.

Referring to FIG. 1, the semiconductor device 10 is formed on a device region 11A defined on a Si substrate 11 by a device isolation structure 11B and includes a gate electrode 13 formed on the Si substrate 11 via a gate insulation film 12. Further, a pair of diffusion regions 11a and 11b are formed in the substrate 11 at both lateral sides of the gate electrode 13.

The gate electrode 13 has sidewall surfaces covered by sidewall insulation films 13a and 13b, and a low dielectric constant organic interlayer insulation film 14, typically formed of the film marketed from The Dow Chemical Company under the trademark SiLK, is formed on the Si substrate 11 so as to cover the gate electrode 13 and also the sidewall insulation films 13a and 13b.

On the interlayer insulation film 14, there is formed a similar low dielectric constant organic interlayer insulation film 15, and Cu interconnection patterns 15A and 15B are formed in the interlayer insulation film 15. Further, each of the Cu interconnection patterns 15A and 15B is connected to the diffusion region 11a or 11b through a contact plug 14P or 14Q formed in the interlayer insulation film 14.

The Cu interconnection patterns 15A and 15B are covered by another low-dielectric organic interlayer insulation film 16 formed on the interlayer insulation film 15, and a further low-dielectric organic interlayer insulation film 17 is formed on the interlayer insulation film 16.

In the illustrated example, Cu interconnection patterns 16A-16C are formed in the interlayer insulation film 16, and Cu interconnection patterns 17A and 17B are formed in the interlayer insulation film 17, wherein the interconnection patterns 16A and 16C are connected to the interconnection patterns 15A and 15B through via-plugs 16P and 16Q respectively, while the interconnection patterns 17A and 17B are connected to the interconnection patterns 16A and 16C through via-plugs 17P and 17Q, respectively.

Further, in the illustrated example, SiOC interlayer insulation films 18, 19 and 20 are stacked consecutively on the interlayer insulation film 17, and interconnection patterns 18A, 19A and 20A of Cu or Al are embedded in the interlayer insulation films 18, 19 and 20, respectively.

The interconnection patterns 18A, 19A and 20A are connected electrically with each other by via-plugs not illustrated while the interconnection pattern 18A is connected to any of the interconnection patterns 17A and 17B by a via-plug not illustrated.

In the illustrated structure of FIG. 1, an SiOC film 21 is formed further on the interlayer insulation film 20, and a contact pad not illustrated is formed on the SiOC film 21 so as to avoid the device region or the multilayer interconnection region. Further, a bonding wire is connected to the contact pad by way of wire bonding process.

In the illustrated example, the Cu interconnection patterns 15A, 14B, 16A-16C, 17A, 17B, and the like, are formed by a damascene process or dual damascene process that uses a CMP process. Thus, the interlayer insulation films 15-17 have a characteristically flat top surface.

Thus, the semiconductor device 10 of FIG. 1 has the feature of reduced signal delay as a result of the use of the interlayer insulation film of low dielectric constant in combination with the low resistance Cu interconnection pattern, and thus, the semiconductor device can provide high-speed operation.

On the other hand, the inventor of the present invention has discovered that there is a case, when the semiconductor device is subjected to very stringent device miniaturization such as the one applied with the design rule of 0.1 μm or less, in that defective contacts or defective electrical connection are caused in the multilayer interconnection structure such as the one shown in FIG. 1, particularly at the time of wire bonding process.

Figure 2:
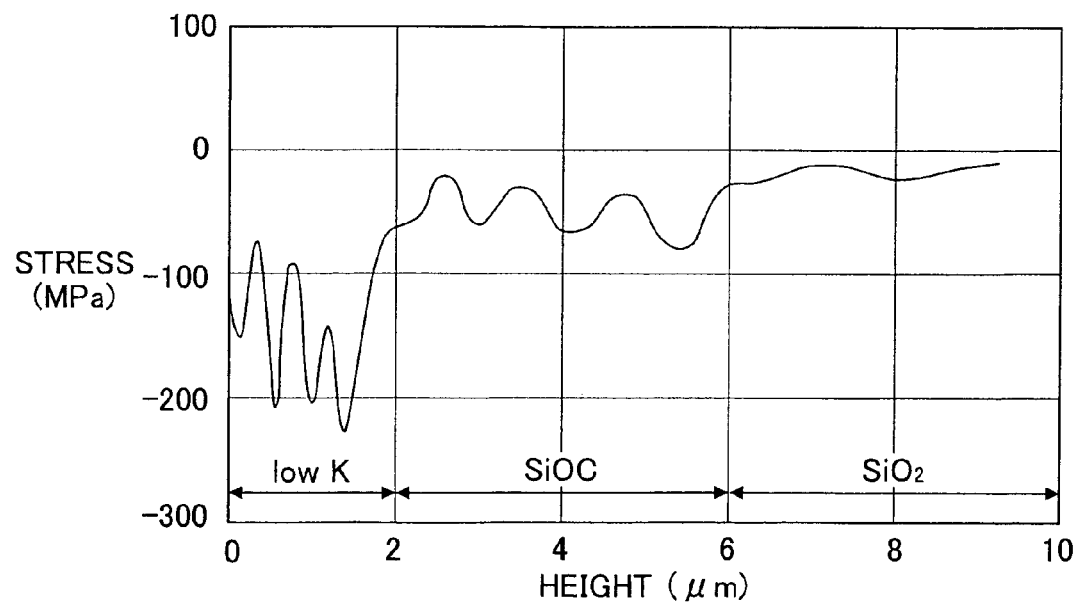
FIG. 2 is a diagram showing a stress distribution in the multilayer interconnection structure of FIG. 1.
Figure 3:
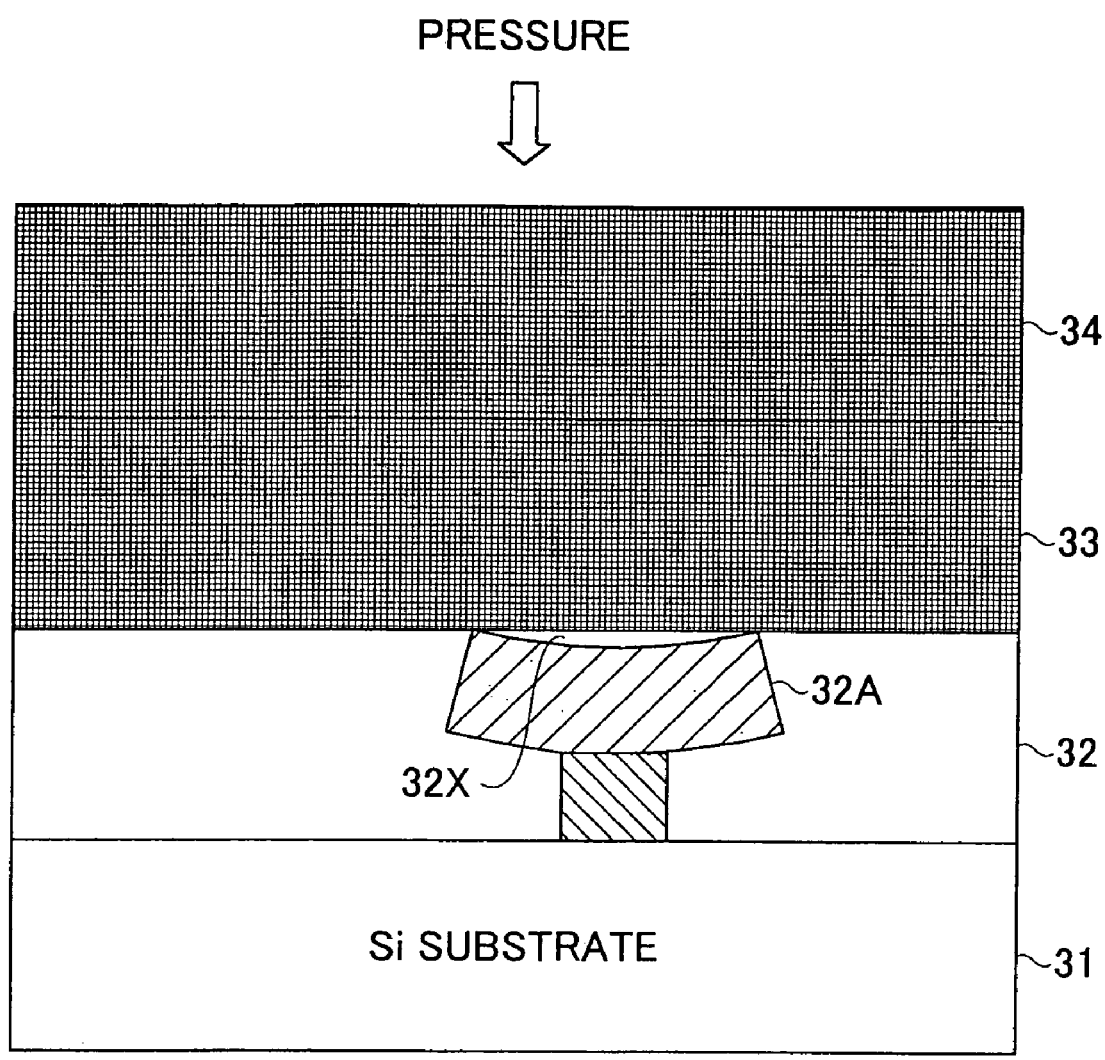
FIG. 3 is a diagram showing a model structure corresponding to the stress distribution of FIG. 2.

FIG. 2 shows the stress distribution inside a stacked structure in which a low-dielectric lower layer film (SiLK) 32 having a thickness of 2 μm and an SiOC intermediate layer film 33 having a thickness of 4 μm are stacked on a Si substrate 31 and an $SiO_2$ upper layer film 34 having a thickness of 4 μm is stacked further thereon as shown in FIG. 3, wherein the stress distribution of FIG. 2 is for the case a stress of 0.01 GPa is applied to such a structure.

It should be noted that the relationship of FIG. 2 is obtained by the inventor of the present invention in the investigation constituting the foundation of the present invention. In FIG. 2, the calculation is made on the assumption that the low-dielectric lower film 32 has an elastic modulus or Young modulus of 2.5 GPa, the intermediate film 33 has a Young modulus of 20 GPa and the upper layer film has a Young modulus of 70 GPa. In FIG. 2, the stress represented in the vertical axis is defined such that the stress applied in the downward direction has a negative value.

Referring to FIG. 2, it can be seen that, in such a structure in which a low-dielectric organic insulation film of small elastic modulus and an inorganic insulation film having a large elastic modulus are stacked, there occurs no substantial concentration of stress in any of the upper layer film 34 or intermediate layer film 33, while there is caused a severe concentration of stress in the low-dielectric film 32.

As a result of the severe concentration of stress in such a low-dielectric interlayer insulation film, the Cu pattern 32A in the low-dielectric lower layer film 32 undergoes deformation as shown in FIG. 3, and when the stress in the film exceeds the fracture toughness of the Cu pattern, there is caused plastic deformation in the Cu pattern.

When such a plastic deformation is caused in the Cu pattern, the low-dielectric film 32 recovers gradually to the original state upon removal of the stress, but the Cu pattern 32A never returns to the original state, and there is formed a defect such as a gap 32X between the interconnection patterns as a result.

Generally, inorganic insulation films such as a $CVD-SiO_2$ film have a relatively large Young modulus of 60-70 GPa, while the low-dielectric organic films have a very small Young modulus of only several GPa because of the small density of the film. For example, the aromatic hydrocarbon film used widely under the registered trademark of SiLK has the Young modulus of only 2.5 GPa.

Further, SiOC films formed by a plasma CVD process with a specific dielectric constant of 3.0 or less and thus usable for the low-dielectric interlayer insulation film, such as the low-dielectric plasma CVD-SiOC film marketed from the Novellus Systems, Inc with registered trademark of Coral, or the low-dielectric plasma CVD-SiOC film marketed from Applied Materials, Inc with the registered trademark of Black Diamond, or the low-dielectric plasma CVD-SiOC film marketed from ASM with the registered trademark of Aurora, all have the Young modulus of 20 GPa or less. On the other hand, a stress of 0.1-0.2 GPa is commonly applied to the semiconductor device during the wire bonding process.

Such a problem of damage of the multilayer interconnection structure or active device by the external stress can be tentatively avoided by forming the device region 11A or the multilayer interconnection structure formed thereon so as to avoid the region right underneath the electrode pads on which the wire bonding process is carried out, as shown in the conventional construction of FIG. 1.

Figure 4:
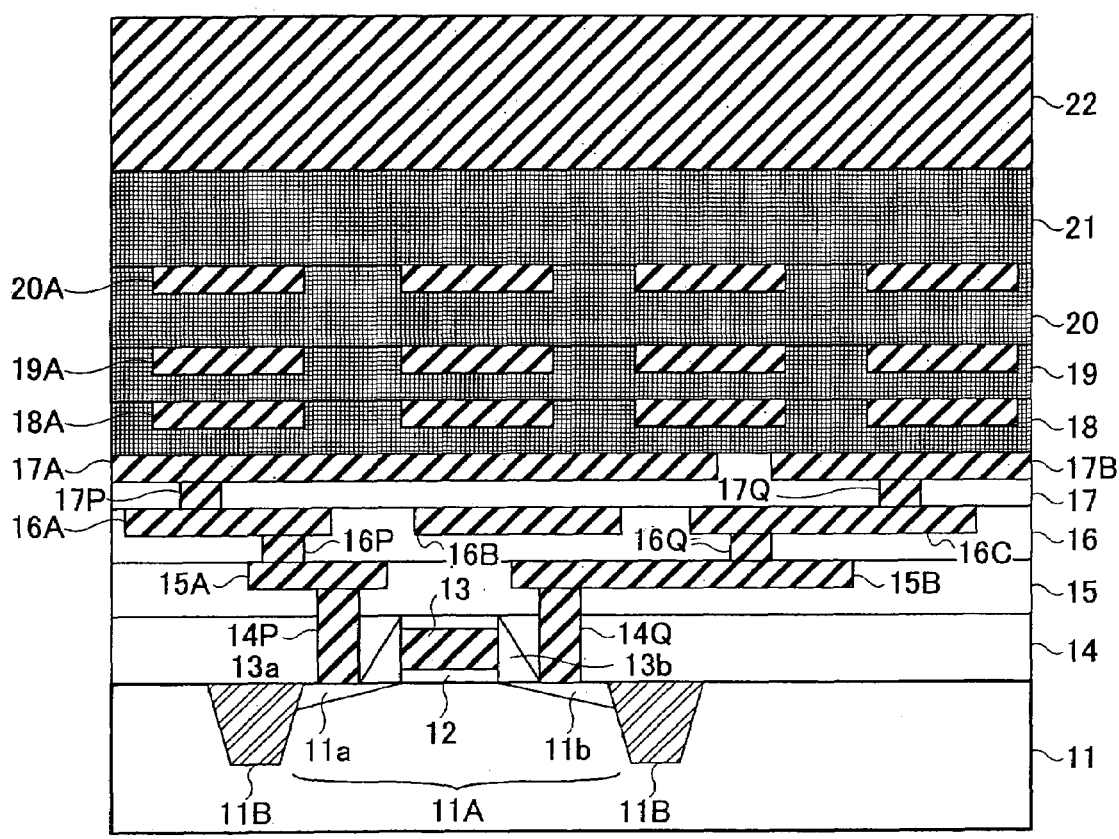
FIG. 4 is a diagram explaining the problem arising in a semiconductor integrated circuit having a conventional multilayer interconnection structure.

However, in the case of recent compact size semiconductor integrated circuit chips such as the one having a length of 100 μm for each edge, particularly in the case of the extremely compact size semiconductor integrated circuit chip having a length of 25 μm for each edge, or in the case of the high performance semiconductor integrated circuit chip in which active devices are formed all over the chip surface, there emerges a situation in which it is inevitable to form the electrode pad 22 directly on the top of the device region 11A or on the multilayer interconnection structure located directly on the top of the device region 11A as shown in FIG. 4.

In such a case, the problem of deformation and disconnection of interconnection pattern in the multilayer interconnection structure, caused by the stress at the time of the wire bonding process as explained previously with reference to FIG. 2 or 3, becomes a serious problem.

Further, there is a possibility that the foregoing problem of deformation and disconnection of the interconnection pattern in the multilayer interconnection structure by the stress concentration caused in such a low-dielectric interlayer insulation film, occurs similarly at the time of dicing a semiconductor wafer on which a large number of semiconductor integrated circuits are formed.

In this case, the stress of the dicing saw acts upon the multilayer interconnection structure including a low dielectric interlayer insulation film through the upper multilayer interconnection structure having a large elastic modulus.

FIRST EMBODIMENT

Figure 5:
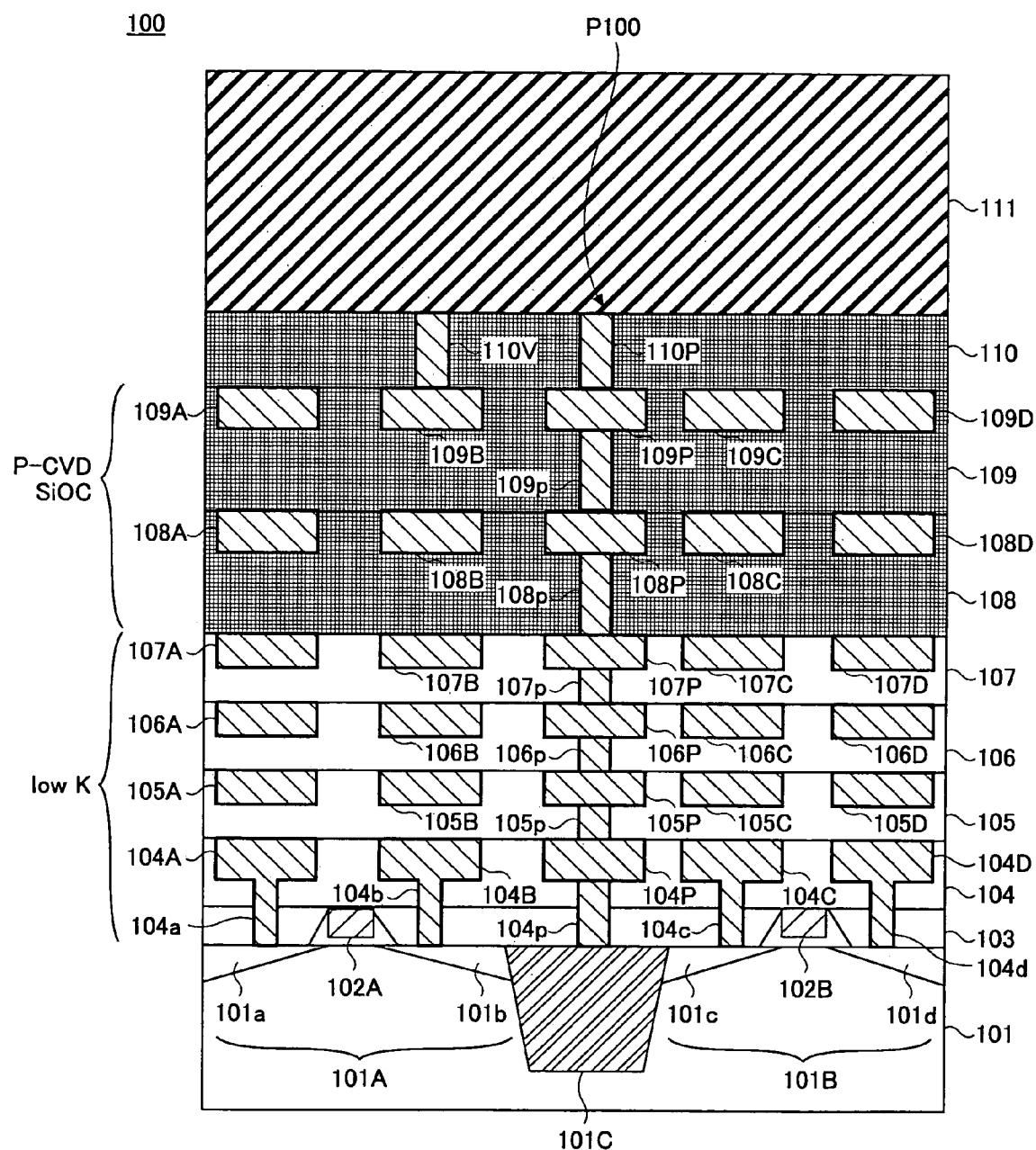
FIG. 5 is a diagram showing the construction of a semiconductor integrated circuit according to a first embodiment of the present invention.

FIG. 5 shows the construction of a semiconductor integrated circuit 100 according to a first embodiment of the present invention.

Referring to FIG. 5, the semiconductor integrated circuit 100 is formed on a Si substrate 101 defined with device regions 101A and 101B by a device isolation structure 101C such as an STI structure, and a gate electrode 102A having a pair of sidewall insulation films is formed on the Si substrate 101 in the device region 101A via a gate insulation film. Further, diffusion regions 101*a* and 101*b* are formed in the Si substrate 101 at both lateral sides of the gate electrode 102A.

Similarly, a gate electrode 102B having a pair of sidewall insulation films is formed on the Si substrate 101 via a gate insulation film in the device region 101B, and diffusion regions 101*c* and 101*d* are formed in the Si substrate 101 at both lateral sides of the gate electrode 102B.

The gate electrodes 102A and 102B are covered with a low dielectric interlayer insulation film 103 such as SiLK, and the like, wherein the interlayer insulation film 103 is formed on the Si substrate 101 and has a specific dielectric constant of typically less than 3.0. Further, a similar low dielectric interlayer insulation film 104 including therein Cu interconnection patterns 104A, 104B, 104C and 104D is formed on the interlayer insulation film 103. Similarly to the example of FIG. 1, the Cu interconnection patterns 104A, 104B, 104C and 104D are connected to respective, corresponding diffusion regions 101*a*, 101*b*, 101*c* and 101*d* electrically through respective contact holes 104*a*, 104*b*, 104*c* and 104*d*.

Further, on the low dielectric constant interlayer insulation film 104, similar low dielectric constant interlayer insulation films 105, 106 and 107 are stacked consecutively, and Cu interconnection patterns 105A-105D are formed in the low dielectric constant interlayer insulation film 105. Further, Cu interconnection patterns 106A-106D are formed in the low dielectric interlayer insulation film 106. Further, Cu interconnection patterns 107A-107D are formed in the low dielectric interlayer insulation film 107. These interconnection patterns are connected mutually with each other in accordance with a desired circuit pattern by via-plugs not illustrated.

As we explained previously, these interlayer insulation films have the Young modulus of only about 2.5 GPa in the case of using SiLK for the low dielectric interlayer insulation films 103-107.

Further, in the structure of FIG. 5, interlayer insulation films 108 and 109 formed of an $SiO_2$ film or an SiOC film are deposited consecutively on the interlayer insulation film 107 by a plasma CVD process, and interconnection patterns 108A-108D of Cu or an Al alloy is formed in the interlayer insulation film 108. Further, similar interconnection patterns 109A-109D are formed in the interlayer insulation film 109. These interconnection patterns are connected mutually with each other in accordance with a desired circuit pattern.

In the structure of FIG. 5, a further insulation film 110 of SiOC or $SiO_2$ is formed on the interlayer insulation film 109 by a plasma CVD process, and a contact pad 111 for wire bonding is formed on the SiOC film 110 thus formed. In the illustrated example, the contact pad is connected to the interconnection pattern 109B via a contact plug 110V in the passivation film 110. In the structure of FIG. 5, it should be noted that the interlayer insulation films 108-110 have a Young modulus of 60-70 GPa.

In the semiconductor integrated circuit 100 of FIG. 5, there is formed a pillar P100 on the device isolation structure 101C so as to extend straight continuously from the device isolation structure 101C to the contact pad 111.

In the present embodiment, the pillar P100 is formed concurrently, in each of the interlayer insulation films, to the interconnection patterns or the via-plugs formed in that interlayer insulation film, and thus, the pillar P has the same layered structure as that of the interconnection patterns or the via-plugs in the interlayer insulation film in which the pillar P is formed.

More specifically, in the interlayer insulation film 103 and 104, the pillar P100 includes a Cu pattern 104P formed with the same level as the interconnection patterns 104A-104D and a Cu plug 104*p* formed with the same level as the via-plugs 104*a*-104, while in the interlayer insulation film 105, the pillar 100 includes a Cu pattern 105P formed with the same level as the interconnection patterns 105A-105D and a Cu plug 105*p* formed with the same level as the via-plugs 105*a*-105*d*.

Further, the pillar P100 includes, in the interlayer insulation film 106, a Cu pattern 106P formed with the same level as the interconnection patterns 106A-106D and a Cu plug 106*p* formed with the same level as the via-plugs 106*a*-106*d*, while in the interlayer insulation film 107, the pillar P100 includes a Cu pattern 107P formed with the same level as the interconnection patterns 107A-107D and a Cu plug 107*p* formed with the same level as the via-plugs 107*a*-107*d*.

Further, the pillar P100 includes, in the interlayer insulation film 108, a Cu pattern 108P formed with the same level as the interconnection patterns 108A-108D and a Cu plug 108*p* formed with the same level as the via-plugs 108*a*-108*d*, while in the interlayer insulation film 109, the pillar 100 includes a Cu pattern 109P formed with the same level as the interconnection patterns 109A-109D and a Cu plug 109*p* formed with the same level as the via-plugs 109*a*-109*d*.

Further, in the structure of FIG. 5, the pillar P100 engages to the bottom surface of the contact pad 111 via a plug 110P formed in the passivation film 110.

Thus, the members 104P-110P and 104*p*-109*p* constituting the pillar P100 are aligned on a straight line as we explained before, and thus, the stress applied to the contact pad 111 at the time of the wire bonding process is effectively supported by the pillar P100.

Figure 6:
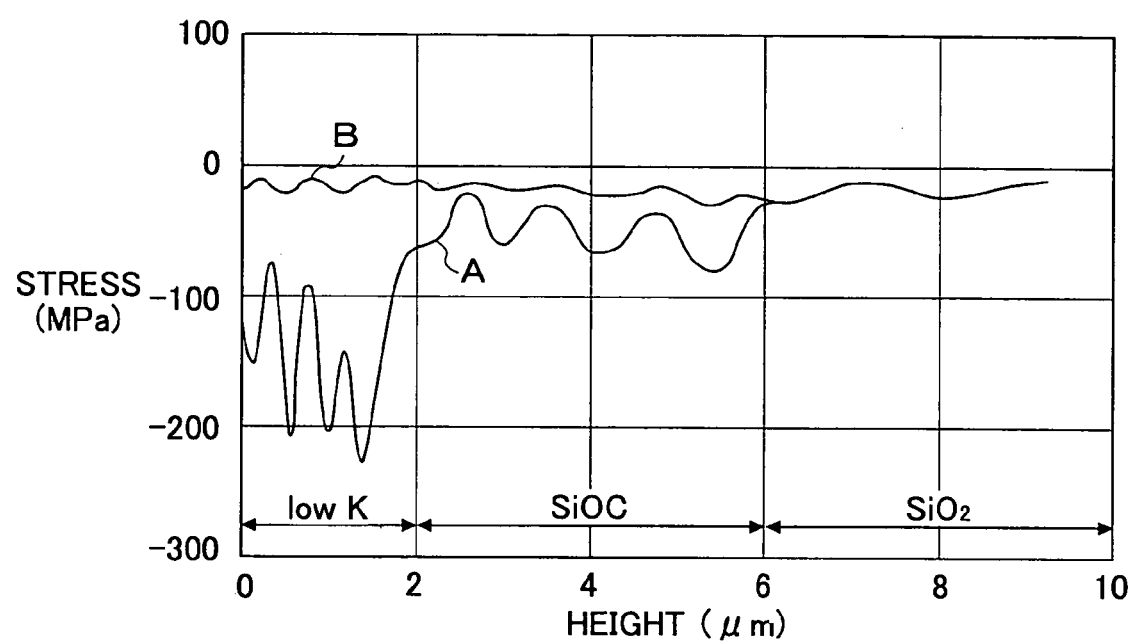
FIG. 6 is a diagram showing the effect of the present invention.

FIG. 6 shows the stress distribution caused in the structure for the model of FIG. 3 explained previously for the case in which the pillar similar to FIG. 5 is provided with the size of 0.14 μm×0.14 μm. In FIG. 6, it should be noted that the stress distribution for the case where no pillar is provided as explained previously with reference to FIG. 2 is represented by a curve A, while the stress distribution for the case the pillar is provided is shown with a curve B.

Referring to FIG. 6, it can be seen that the concentration of the stress in the low dielectric constant film is avoided effectively by way of providing the pillar as shown by a curve A.

FIGS. 7A-7E show a part of the fabrication process of the semiconductor integrated circuit 100 of FIG. 5.

Figure 7A:
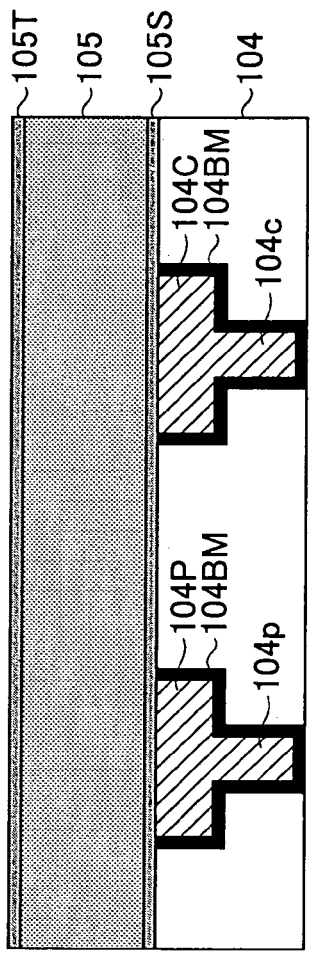
FIGS. 7A-7E are diagrams showing the fabrication process of the semiconductor integrated circuit of FIG. 5.

Referring to FIG. 7A, the low dielectric interlayer insulation film 104 explained with reference to FIG. 5 is formed with the Cu pillar pattern 104P and the Cu pillar plug 104*p* constituting a part of the pillar P, in addition to the Cu interconnection pattern 104C and the Cu via-plug 104*c*, and the next interlayer insulation film 10 is formed on the interlayer insulation film 104 via a barrier film 105S typically formed of SiC.

In the interlayer insulation film 104, it should be noted that the Cu interconnection pattern 104C, the Cu via-plug 104*c*, the Cu pillar pattern 104P and further the Cu pillar plug 104*p* have an interface to the interlayer insulation film 104 covered with a barrier metal film 104BM formed of conductive nitride typically formed of TaN.

Figure 7B:
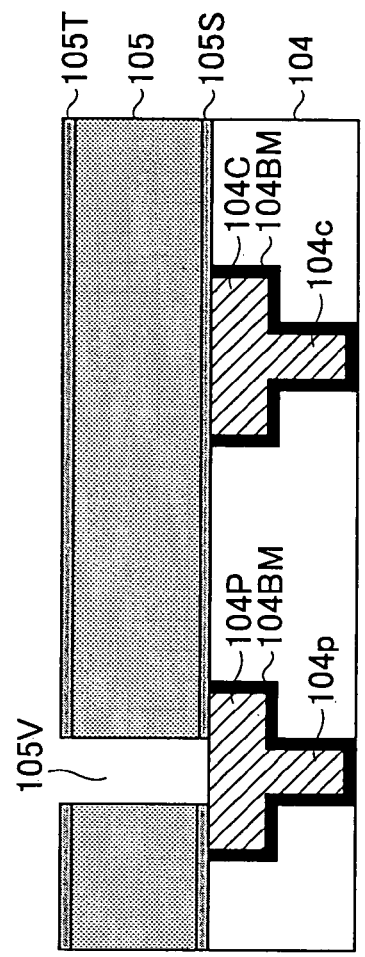

Next, in the step of FIG. 7B, an SiC film 105T formed on the interlayer insulation film 105 is patterned by a resist process to form an opening corresponding to the pillar P, and a via-hole 105V exposing the Cu pillar pattern 104P is formed in the interlayer insulation film 105 by patterning the interlayer insulation film 105 while using the SiC film 105T as a hard mask.

Figure 7C:
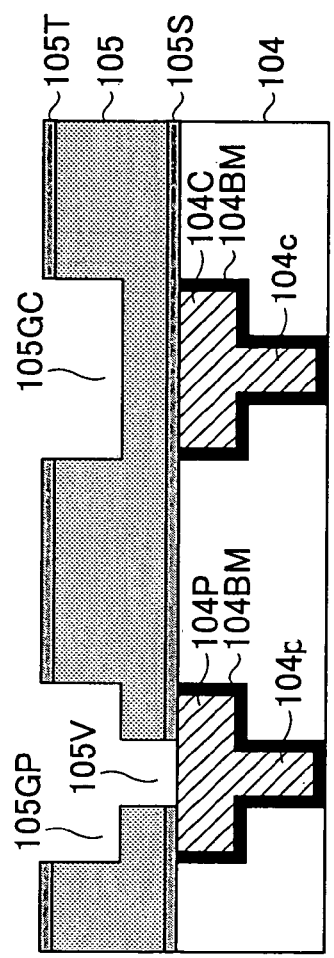

Further, by patterning the SiC film 105T by a further resist process in the step of FIG. 7C, the openings corresponded to the next interconnection pattern 105C and the next pillar pattern 105P are formed, and by patterning the interlayer insulation film 105 while using the SiC film 105T thus patterned as a mask, a wiring groove 105GC corresponding to the Cu interconnection pattern 105C and a groove 105GP corresponding to the Cu pillar pattern 105P are formed in the interlayer insulation film 105 simultaneously.

Figure 7D:
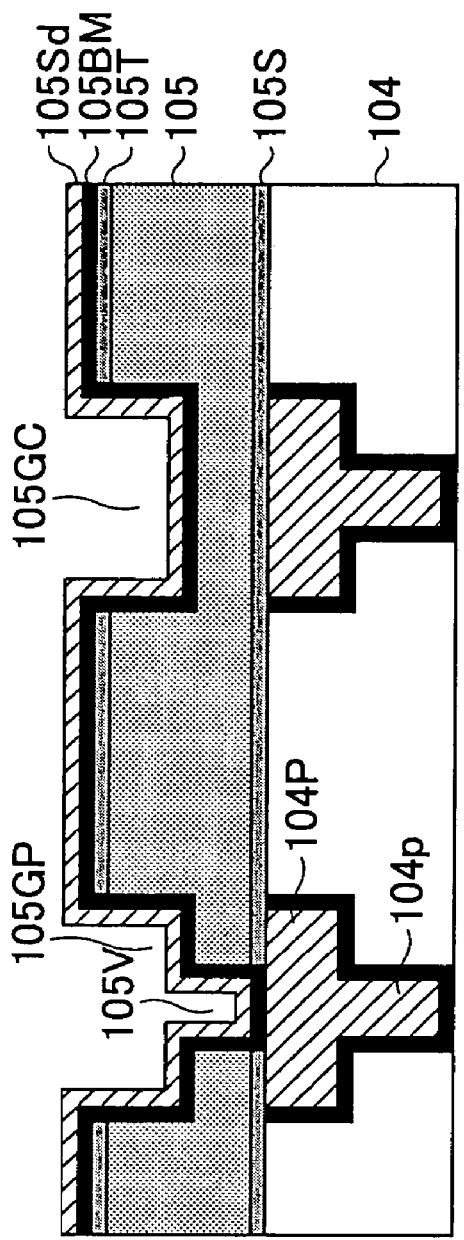

Further, in the step of FIG. 7D, a barrier metal film 105BM of TaN, and the like, is formed on the construction of FIG. 7C, and a Cu Seed layer 105Sd is formed thereon by a sputtering process.

Figure 7E:
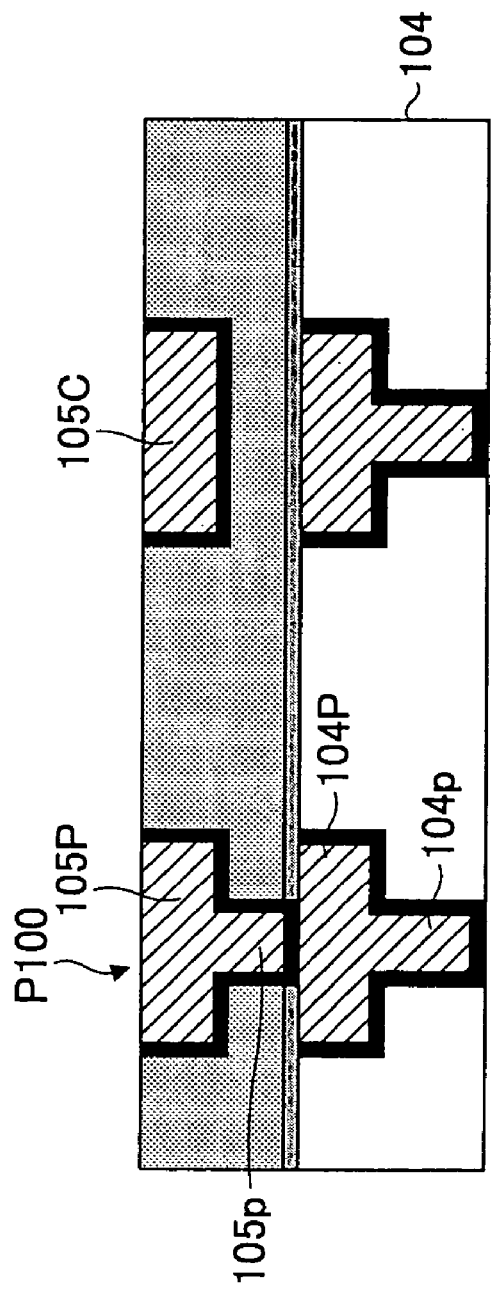

Further, an electrolytic plating process of Cu is conducted in the step of FIG. 7E while using the Cu seed layer 105Sd as an electrode, and by removing the excess Cu layer on the interlayer insulation film 105 by polishing out by a CMP process together with the seed layer 105Sd, the barrier metal film 105BM and further the hard mask layer 105T, there is obtained a structure in the interlayer insulation film 105 in which the Cu interconnection pattern 105C fills the interconnection groove 105GC and the pillar pattern 105P and the pillar plug 105*p* fills the groove 105GP and the via-hole 105V respectively.

The pillar plug 105p thus formed engage the pillar pattern 104P of the lower layer, and thus, by repeating such a process, the pillar P100 is formed so as to extend continuously from the substrate 101 to the contact pad 111.

Figure 8:
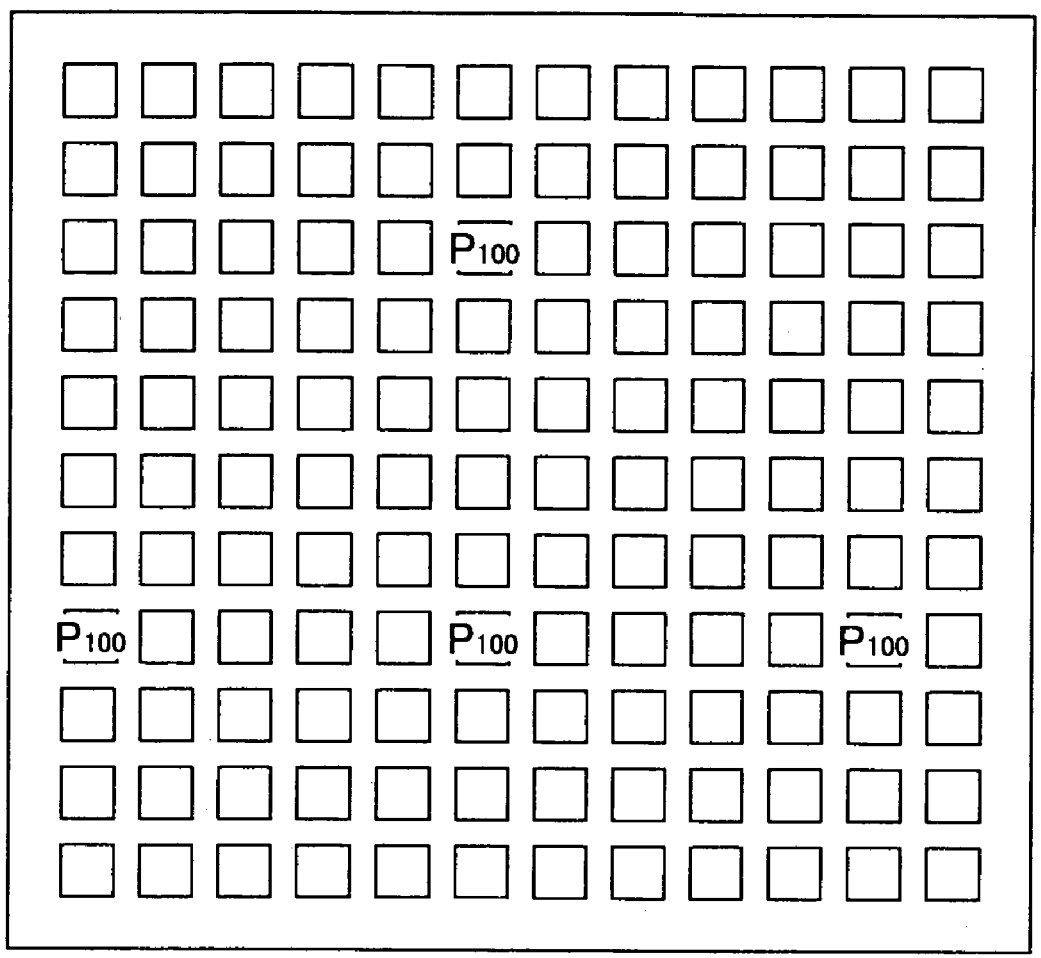
FIG. 8 is a diagram showing an example of the distribution of pillars in the present invention.

Further, the inventor of the present invention has conducted a simulation for evaluating the stress applied to the interconnection pattern with regard to the model multilayer interconnection structure of FIG. 8 in which a number of isolated Cu patterns each having a length of 0.7 μm for each edge are arranged in a matrix form with an interval of 0.4 μm while changing the density of the pillars P variously.

As a result, it was discovered that, apart from the obvious case in which the stress applied to the interconnection pattern for a given layered structure becomes zero when all the Cu patterns form a pillar, the stress applied to the Cu interconnection patterns formed in the interlayer insulation films 103-107 of FIG. 5 can be suppressed to the desired level, set equal to or smaller than 0.8 GPa in the example of the present model, by forming the pillars P so as to occupy an area of 15% or more of the substrate. More specifically, in the case the pillars P are formed so as to occupy the area of 4% of the substrate, a stress of 0.88 GPa is applied to the interconnection patterns, while in the case the pillars are formed so as to occupy 16% of the area, a stress of 0.79 GPa is applied. Further, in the case the pillars are formed so as to occupy 48% of the area, the stress applied to the interconnection layer becomes 0.74 GPa.

In the present embodiment, it is preferable that the pillars P100 are formed with as large number as possible right underneath the contact pad 111 and as uniform density as possible.

In the present embodiment, it is possible to use, for the low dielectric interlayer insulation films 103-107, the films having a specific dielectric constant of 3.0 or less, such as an SOG film, a low dielectric CVD-SiOC film marketed with registered trademark Coral from Novellus Systems, Inc., a low dielectric CVD-SiOC film marketed under the registered trademark Black Diamond from the Applied Materials, Inc., a low dielectric FSG film (so-called low FSG film), an MSQ film, an HSQ film, an FSQ film, and the like, in addition to SiLK.

These include an HSQ spin-on film marketed from Dow Corning Silicone, an all-aromatic aryl ether spin-on film marketed with registered trademark ALCAP-E from Asahi Kasei, an aryl ether spin-on film marketed with registered trademark FLARE from Honeywell Inc., an aryl ether spin-on film marked with registered trademark SiLK. from The Dow Chemical Company, a benzocyclobuthene (BCB) spin-on film marketed from The Dow Chemical Company, a benzocyclobuthene (BCB) CVD film marketed from The Dow Chemical Company, an inorganic or organic SiOCH-CVD film marketed with registered trademark Black Diamond from Applied Materials, Inc., an FSQ (fluorine-containing hydrogen silsesquioxane) spin-on film marketed from Fujitsu Limited and Trichemical Company, an inorganic or organic methyl silsesquioxane (MSQ) spin-on film marketed with registered trademark LKD-T200 from the JSR Corporation, an inorganic or organic SiOCH-CVD film marketed with registered trademark Coral from Novellus Systems, Inc. noted before, an inorganic or organic SiOCH-CVD film marketed with trade mark Aurora from ASM International Inc, an inorganic or organic MSQ spin-on film marketed with registered trademark HOSP from the Honeywell International Inc., an inorganic porous HSQ spin-on film marketed with porous HSQ from the Dow-Corning Silicone, an organic porous aryl ether spin-on film marketed with registered trademark ALS-400 from Sumitomo Chemical Co., Ltd., an inorganic or organic SiH-family porous spin-on film marketed with registered trademark IPS from Nippon Shokubai Co., Ltd., an inorganic or organic SiOCH spin-on film marketed with registered trademark Nanoglass-E from Honeywell International, Inc., an inorganic or organic porous MSQ spin-on film marketed with registered trademark LKD-T400 from the JSR Corporation, an inorganic porous silica spin-on film marketed with registered trademark ALCAP-S from Asahi Kasei, an organic porous aryl ether spin-on film marketed a porous SiLK from The Dow Chemical Company, an organic porous aryl ether spin-on film marketed as porous FLARE form Honeywell International Inc., and an inorganic high-pressure dried porous silica film marketed as silica aerogel from Kobe Steel, Ltd.

SECOND EMBODIMENT

Figure 9:
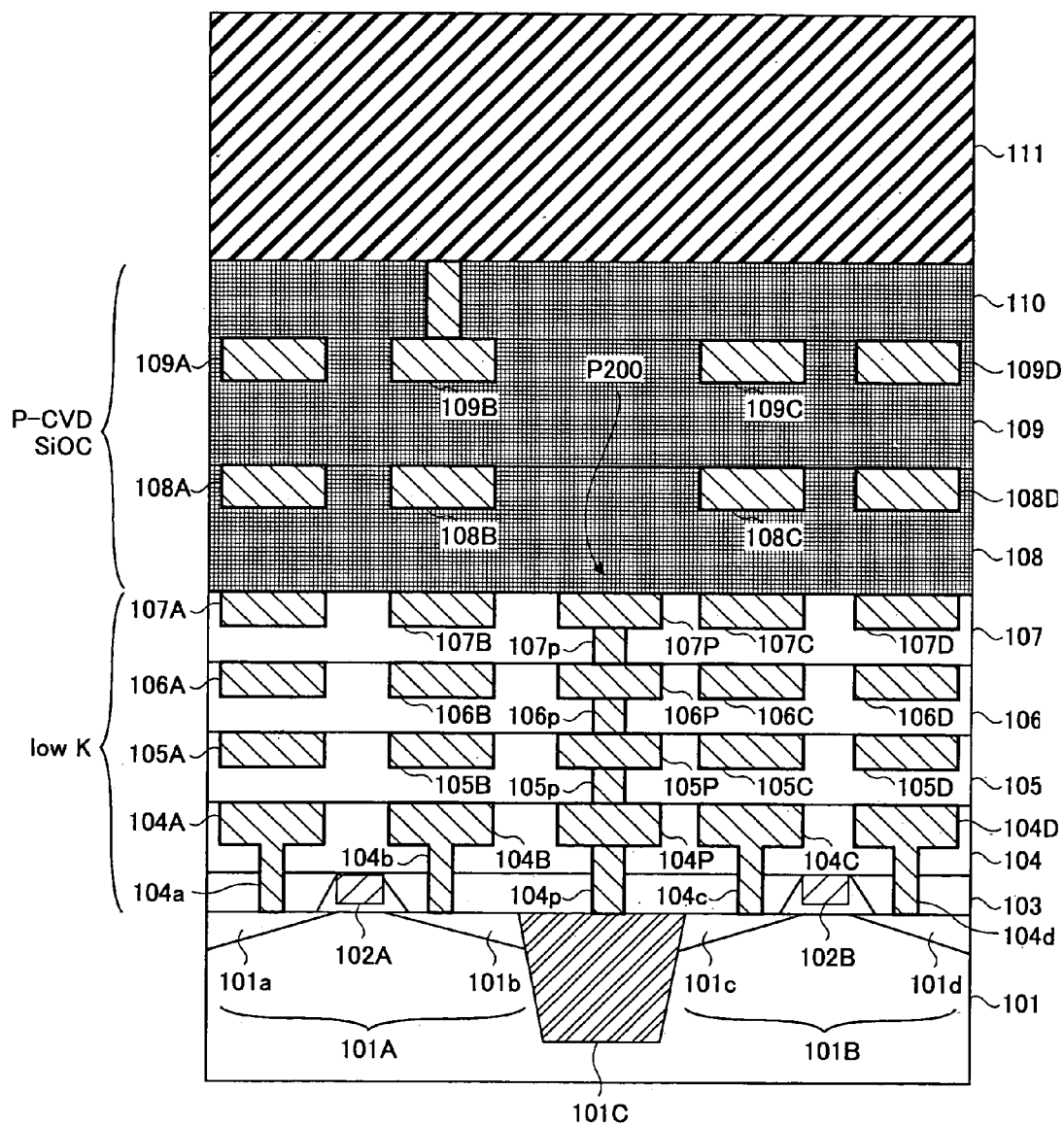
FIG. 9 is a diagram showing the construction of a semiconductor integrated circuit according to a second embodiment of the present invention.

FIG. 9 shows the construction of a semiconductor integrated circuit 200 according to a second embodiment of the present invention, wherein those part in FIG. 9 explained previously are designated with the same reference numerals and description thereof will be omitted.

Referring to FIG. 9, the semiconductor integrated circuit 200 has a construction similar to that of the semiconductor integrated circuit 100 of FIG. 5 except that a pillar P200 extends through the low dielectric multilayer interconnection structure in place of the pillar P100, and thus, the edge of the pillar P supports the bottom of the interlayer insulation film 108.

In the construction of FIG. 9, too, the interlayer insulation films 108-110 have a relatively large Young modulus, and thus, the stress applied to the contact pad 111 is transmitted to the low dielectric interlayer insulation films 103-107 efficiently as explained previously with reference to FIG. 2. Thus, the stress is effectively supported by the pillar P200 thus formed in the low dielectric constant interlayer insulation films 103-107 also in the present embodiment, and application of the stress to the minute Cu interconnection patterns is avoided effectively.

THIRD EMBODIMENT

Figure 10:
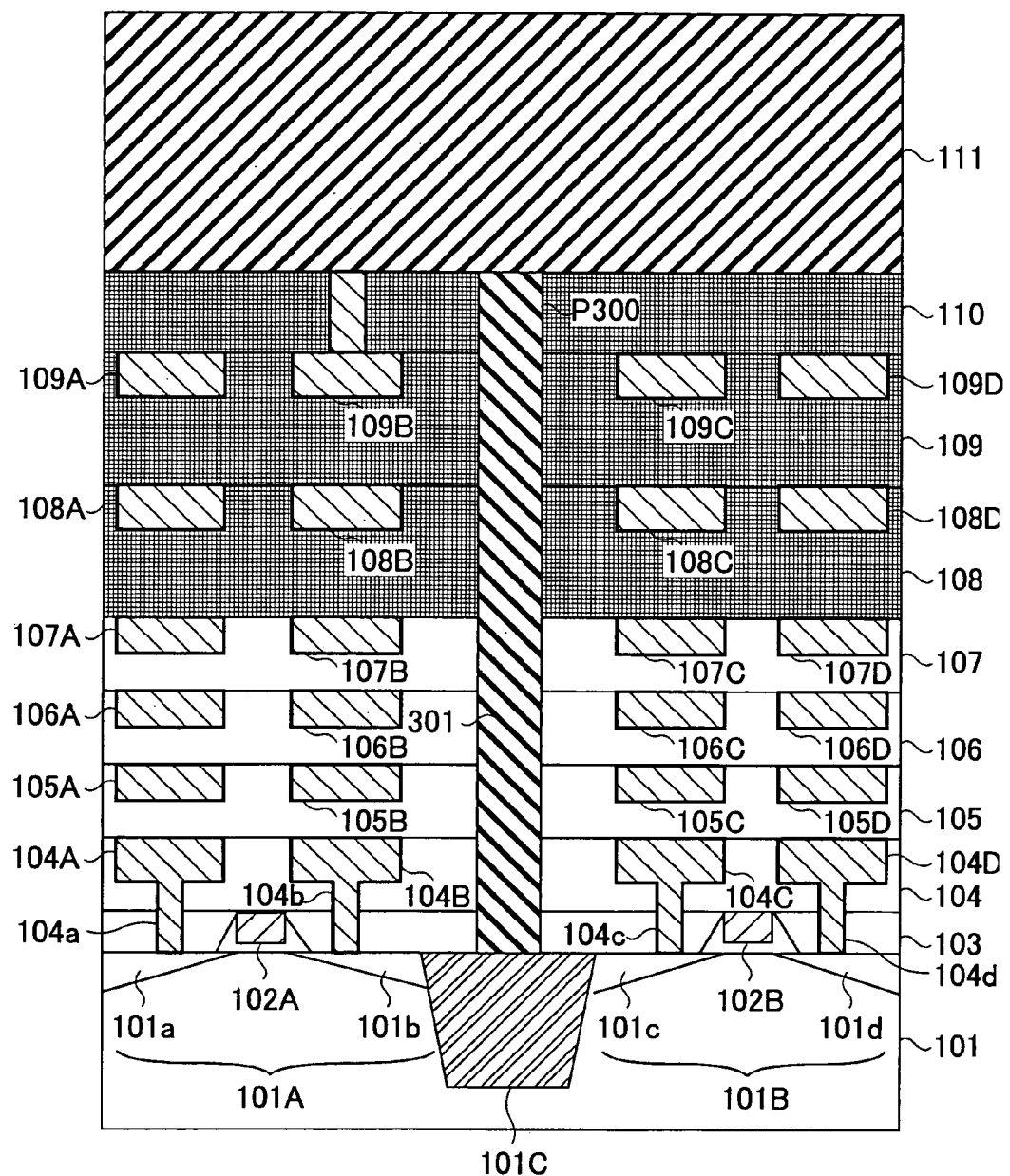
FIG. 10 is a diagram showing the construction of a semiconductor integrated circuit according to a third embodiment of the present invention.

FIG. 10 shows the construction of a semiconductor integrated circuit 300 according to a third embodiment of the present invention, wherein those parts corresponding to the parts explained previously are designated by the same reference numerals and the description thereof will be omitted.

Referring to FIG. 10, a through-hole 301 is formed in correspondence to the STI structure 101C in the Si substrate 101 in the present embodiment so as to penetrate through the interlayer insulation films 103-110, and a pillar P300 of W is formed in the through-hole 301 continuously and straight from the STI structure 101C to the contact pad 111.

Figure 11:
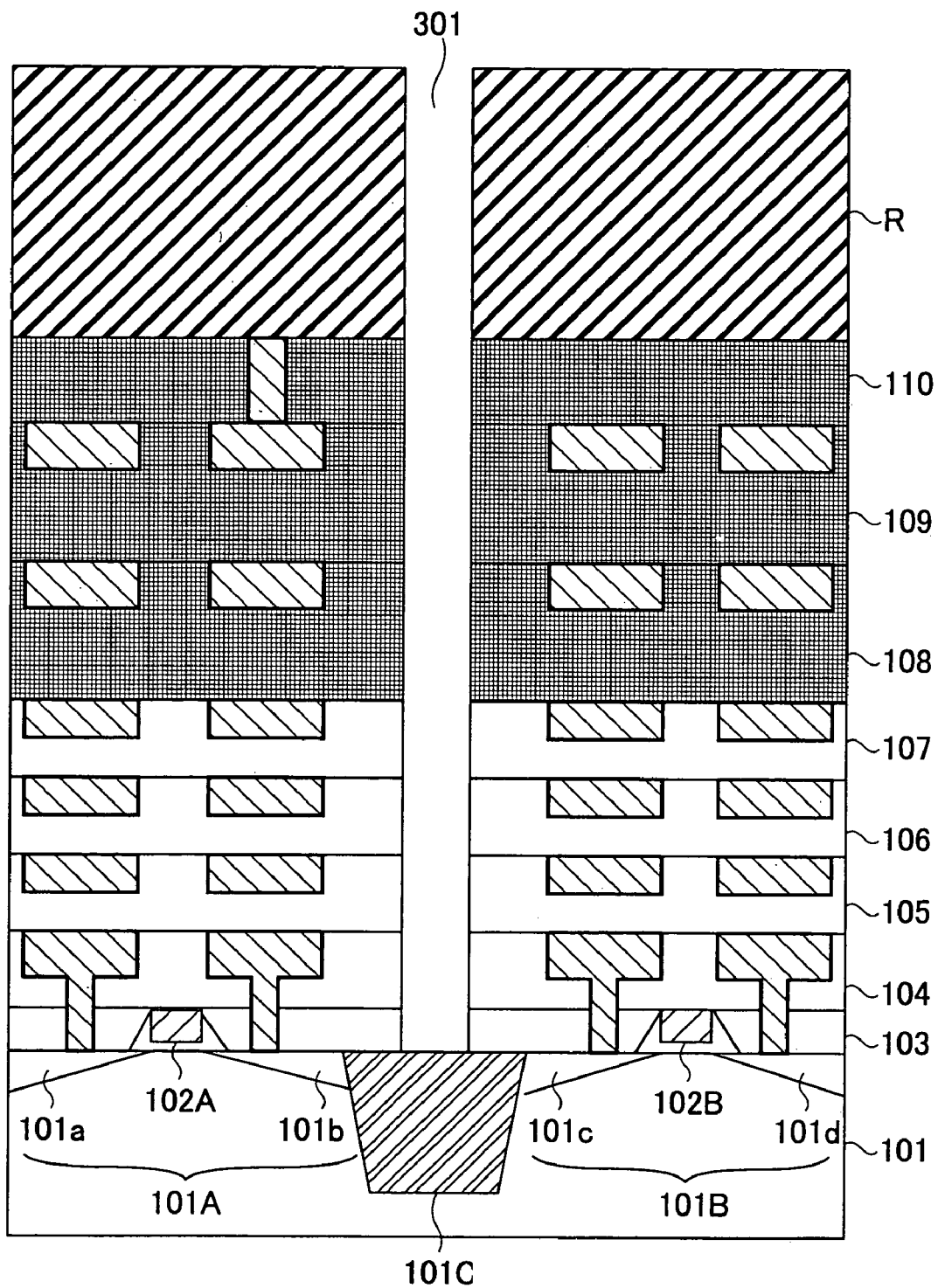
FIG. 11 is a diagram showing a fabrication process of the semiconductor integrated circuit of FIG. 10.

FIG. 11 shows the fabrication process of the structure of FIG. 10.

Referring to FIG. 11, a stacked structure including the interlayer insulation films 103-110 is formed on the Si substrate 101 by conducting a damascene process, and a resist film R is formed on the interlayer insulation film 110. Further, by patterning the stacked structure while using the resist film R as a mask, the through-hole 301 is formed so as to extend continuously through the interlayer insulation films 103-110 and expose the surface of the STI structure 101C.

After the step of FIG. 11, the resist film R is removed and the through-hole 301 is filled with a W film formed by a CVD process of W. Further, by removing the W film remaining on the interlayer insulation film 110 by a CMP process, the continuous pillar P300 of W shown in FIG. 10 is formed in the manner filling the through-hole 301.

Figure 12:
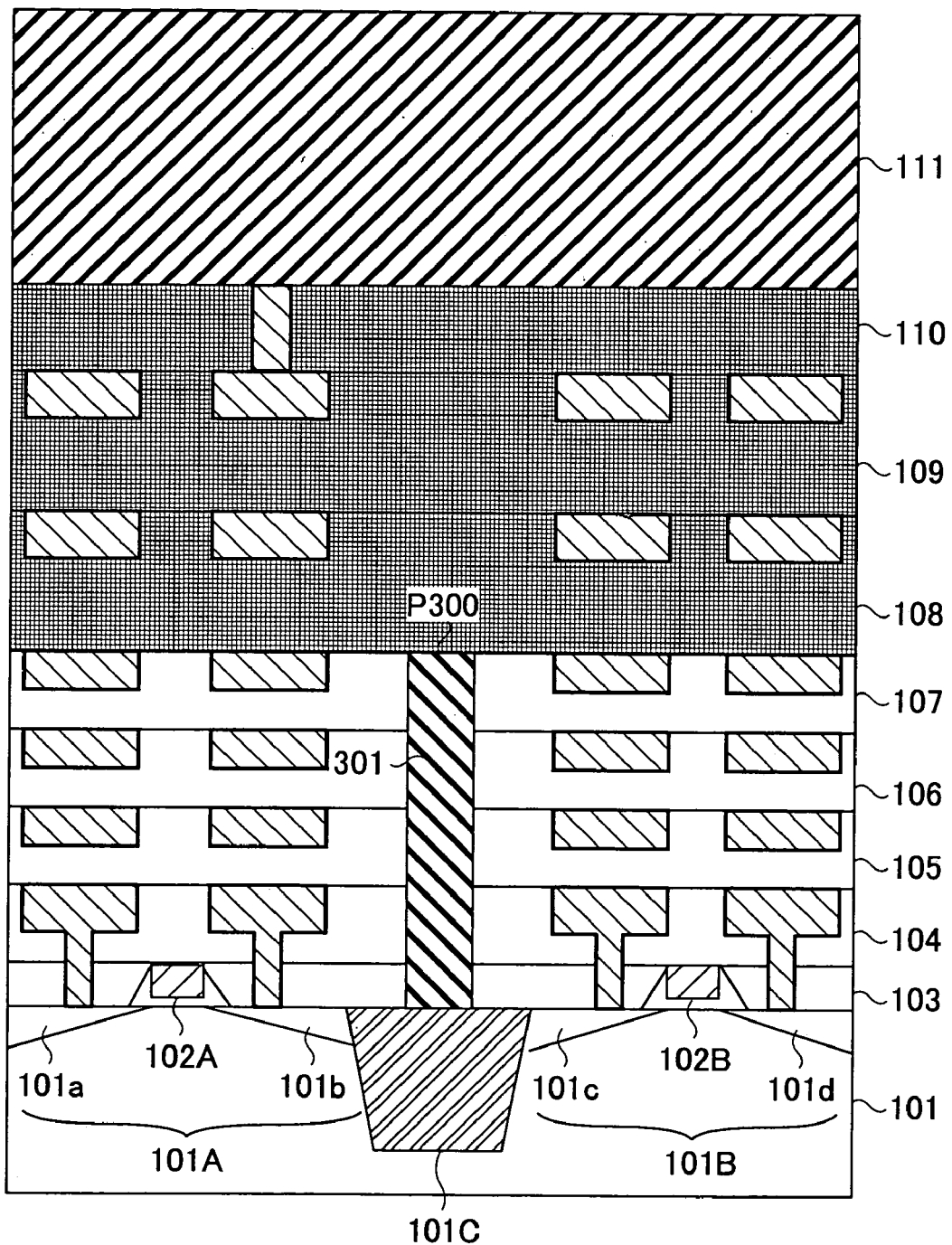
FIG. 12 is a diagram showing a modification of the semiconductor integrated circuit of FIG. 10.

Furthermore, as a modification of the embodiment of FIG. 10, it is possible to form the through-hole 301 only in the interlayer insulation films 103-107 as shown in FIG. 12 and form the multilayer interconnection structure including the interlayer insulation films 108-110 and the respective interconnection patterns on such a structure, after filling the through-hole 301 with the W plug P300.

In the present embodiment, the pillar P300 is not limited to a W plug, but may be formed by various film formation process such as a CVD process, electrolytic plating process, non-electrolytic plating process, sputtering process, and the like. Further, the material of the pillar P300 is not limited to W, but may be formed by using a metal such as Cu Al, or Ni, a nitride such as TaN, diamond, fullerene, carbon nano-tube, and the like.

FOURTH EMBODIMENT

Figure 13A:
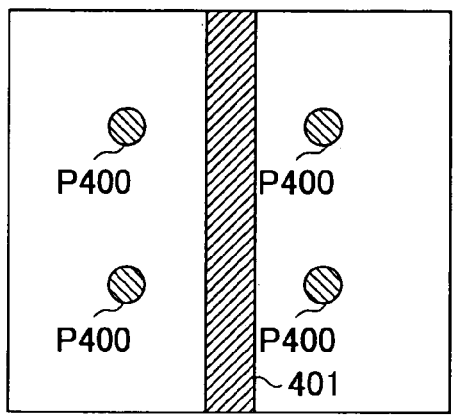
FIGS. 13A-13D are diagrams showing a part of the semiconductor integrated circuit according to a fourth embodiment of the present invention in a plan view.
Figure 13B:
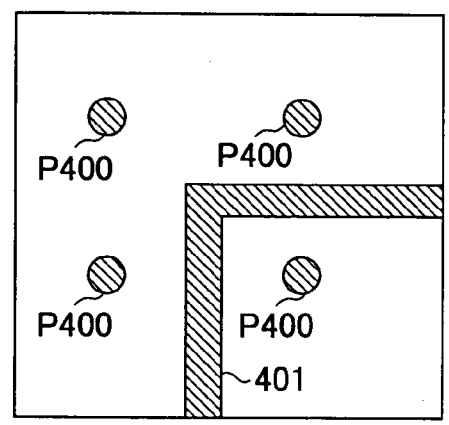

FIGS. 13A and 13B are diagrams showing a part of the semiconductor integrated circuit according to a fourth embodiment of the present invention in a plan view.

As explained previously with reference to FIG. 8, it is desirable to form the pillar of the present invention right underneath the contact pad with a number as large as possible and as uniform as possible. Particularly, from the viewpoint of avoiding the stress concentration to the minute interconnection patterns, it is preferable to dispose the pillars so as to surround an interconnection pattern and support the interconnection pattern from both sides thereof.

FIG. 13A is an example of such arrangement of the pillars. It can be seen that the pillars P400 are arranged at both sides of the interconnection pattern 401. It should be noted that the pillar P400 has a cross-sectional structure similar to any of the pillars P100-300. Further, the interconnection pattern 401 represents an interconnection pattern formed in any of the interlayer insulation films 103-107, in other words, any of the interconnection patterns 104A-104D, 105A-105D, 106A-106D, 107A-107D.

FIG. 13B shows the bend part of the interconnection pattern 401.

In such a bend part, too, the problem of the deformation or disconnection of the interconnection pattern caused by the application of stress to the interconnection pattern 401 can be avoided effectively by arranging the pillars P400 at both sides of the interconnection pattern 401.

Figure 13C:
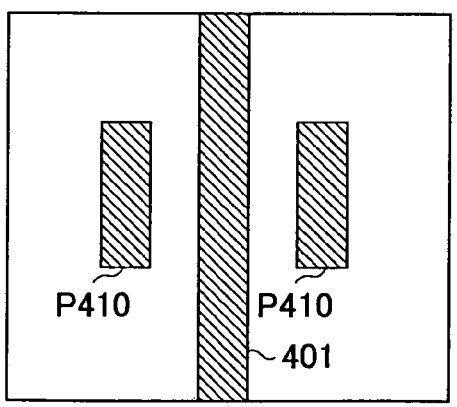
Figure 13D:
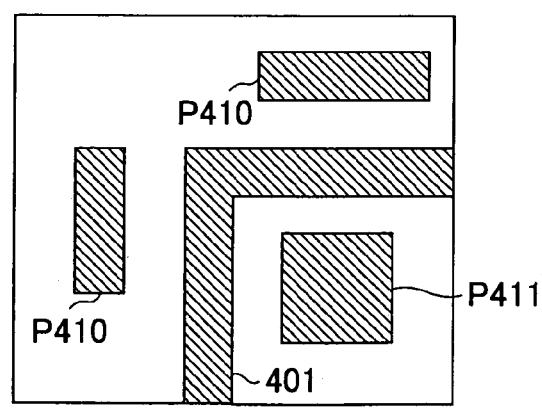

Although a pillar having a circular cross-section such as the pillar P400 is used in the example of FIGS. 13A and 13B, it is also possible to use a pillar P410 having a rectangle cross-section as shown in the modifications of FIG. 13C or 13D.

Referring to FIG. 13C, the pillars P410 extend along the interconnection pattern 401 at both sides thereof in the plan view in the construction of the drawing, and support the stress applied to the interconnection pattern 401.

FIG. 13D shows the bend part of the interconnection pattern 401 of the structure of FIG. 13C. In this case, it can be seen that the pillar P410 of the rectangular cross-section is disposed so as to extend along the interconnection pattern 401 at one side of the interconnection pattern 401 and that a pillar P411 of rectangular shape is formed at the other side.

FIFTH EMBODIMENT

Figure 14:
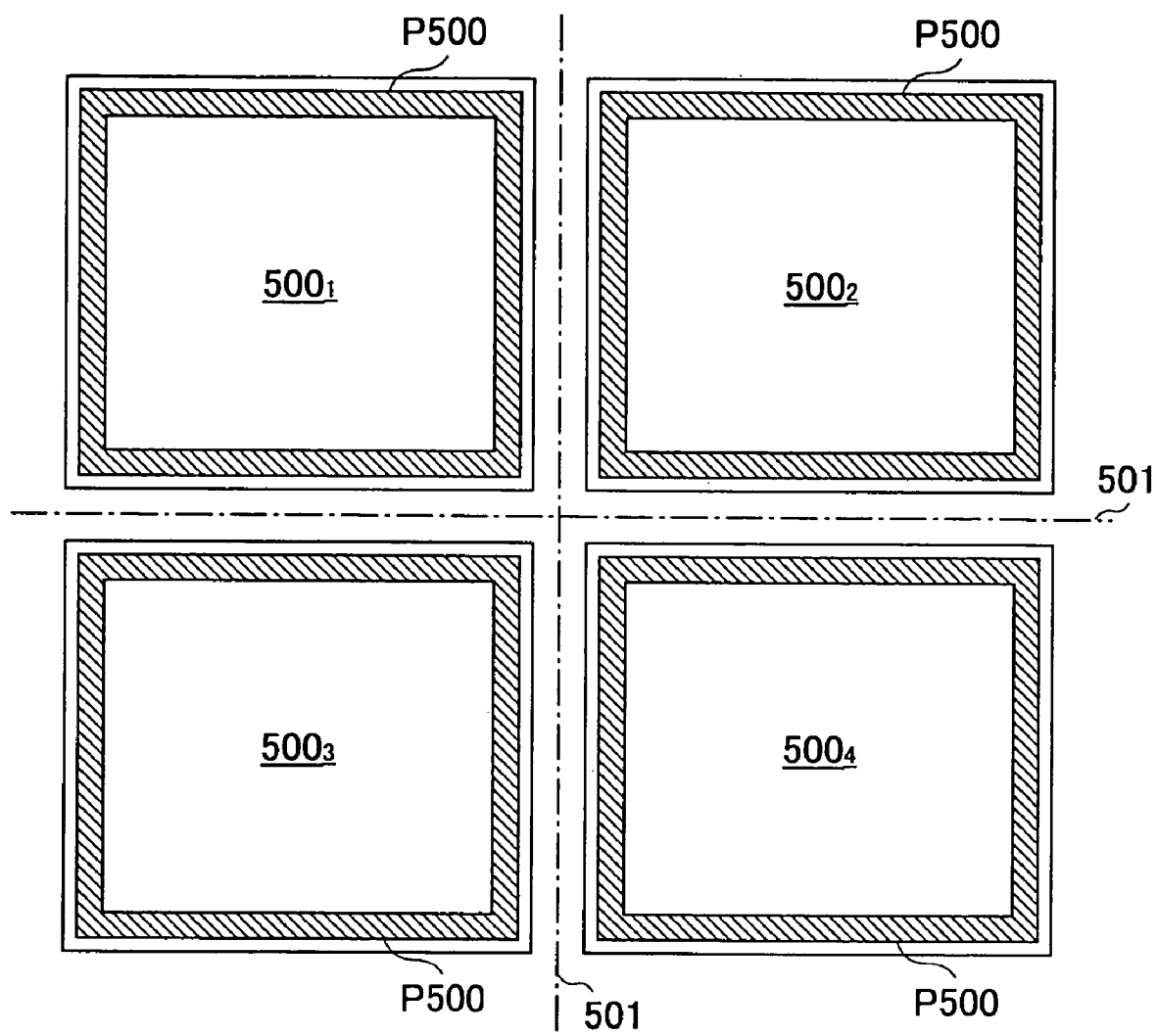
FIG. 14 is a diagram showing a part of the semiconductor wafer according to a fifth embodiment of the present invention in a plan view.

FIG. 14 shows the construction of a semiconductor chip region $500_1$-$500_4$ according to a fifth embodiment of the present invention.

Referring to FIG. 14, the semiconductor chip regions $500_1$-$500_4$ are defined on the silicon wafer in correspondence to the individual semiconductor chips by scribe lines 501.

Hereinafter, only the semiconductor chip region $500_1$ will be explained.

Referring to FIG. 14, it can be seen that there is formed a wall P500 having a cross-sectional structure similar to that of the pillar P100 of FIG. 5 along the scribe line 501 continuously in the semiconductor chip region $500_1$ so as to surround the periphery of the semiconductor chip region 5001.

The wall P500 thus formed functions as a guard ring that blocks the invasion of moisture or gas into the interior of the semiconductor chip, and simultaneously performs the function of interrupting the stress applied to the minute interconnection patterns laid down in the low dielectric interlayer insulation film inside the chip at the time of dicing the silicon wafer by a dicing saw along the 501.

In the explanation of each embodiment heretofore, the pillars formed in the multilayer interconnection structure have been formed on the STI structure 101C. However, the present invention is not limited to such a particular construction, and it is possible to form the pillars also on other insulation films on the Si substrate or on the surface of the Si substrate directly. Yet, it is desirable to avoid active regions such as a diffusion region, and the like.

Further, the present invention is not limited to the case in which the interconnection patterns in the low dielectric interlayer insulation films 103-107 are formed of a Cu interconnection pattern, but is applicable also to the case in which the interconnection pattern is formed of a Cu alloy or Al or an Al alloy. Similarly, the present invention is not limited to the case in which the interconnection patterns in the interlayer insulation films 108-109 are formed of a Cu interconnection pattern but is applicable also to the case in which the interconnection pattern is formed of a Cu alloy or Al or an Al alloy.

SIXTH EMBODIMENT

Figure 15:
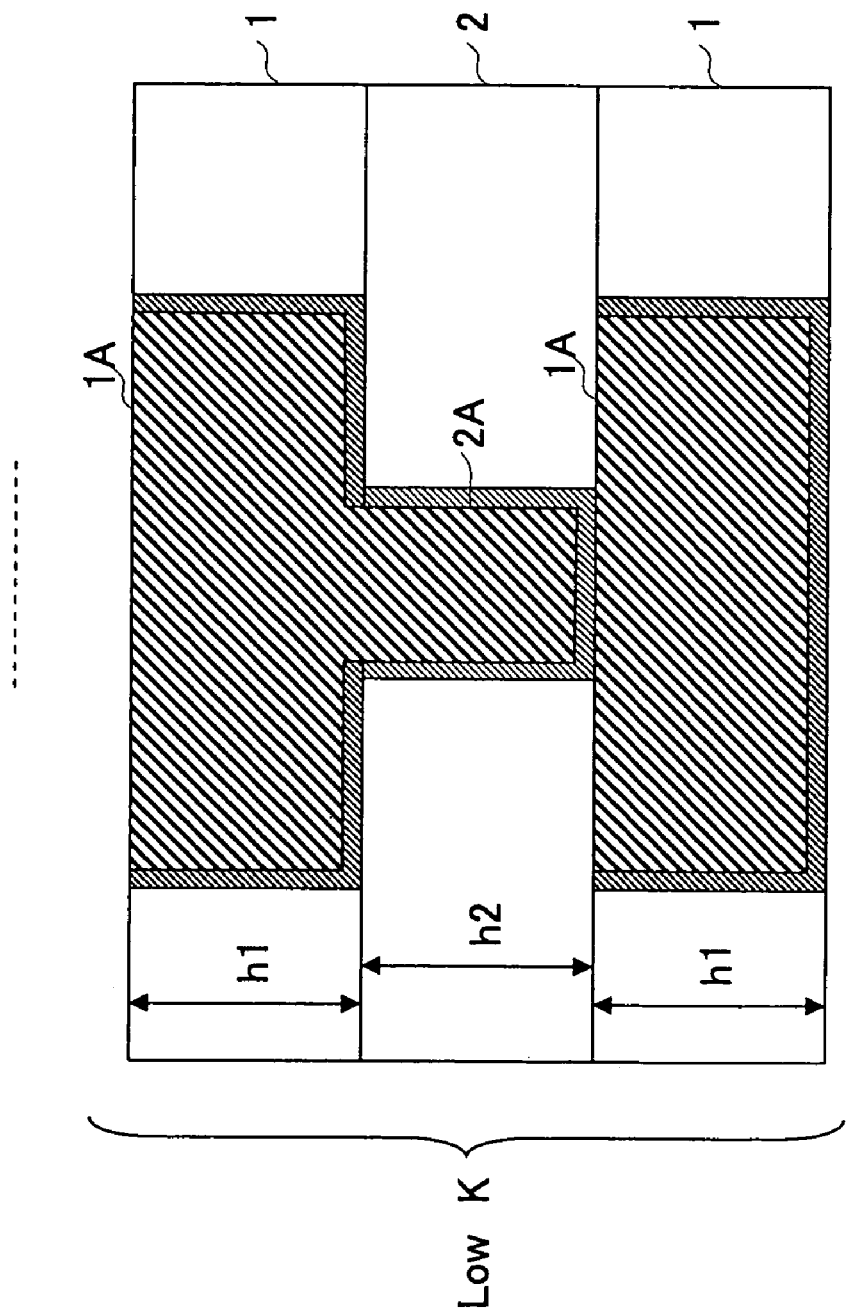
FIG. 15 is a diagram showing a part of the multilayer interconnection structure constructed according to a sixth embodiment of the present invention.

The inventor of the present invention has conducted an experiment in a sixth embodiment of the present invention in search of the stress distribution, in a multilayer interconnection structure corresponding to the semiconductor integrated circuit 100 of the first embodiment explained previously with reference to FIG. 5, for the case the low-K multilayer interconnection structure of FIG. 5 is formed by stacking of a low dielectric interlayer insulation film 1 (SiLK) in which a Cu interconnection layer 1A having a Young modulus of 10 GPa is embedded and an SiOC film 2 in which a Cu via-plug 12A having a Young modulus of 20 GPa is embedded as shown in FIG. 15, while changing the film thickness h2 of the SiOC film 2 variously under the condition that the film thickness hi of the interlayer insulation film 1 is set to 200 nm.

Figure 16:
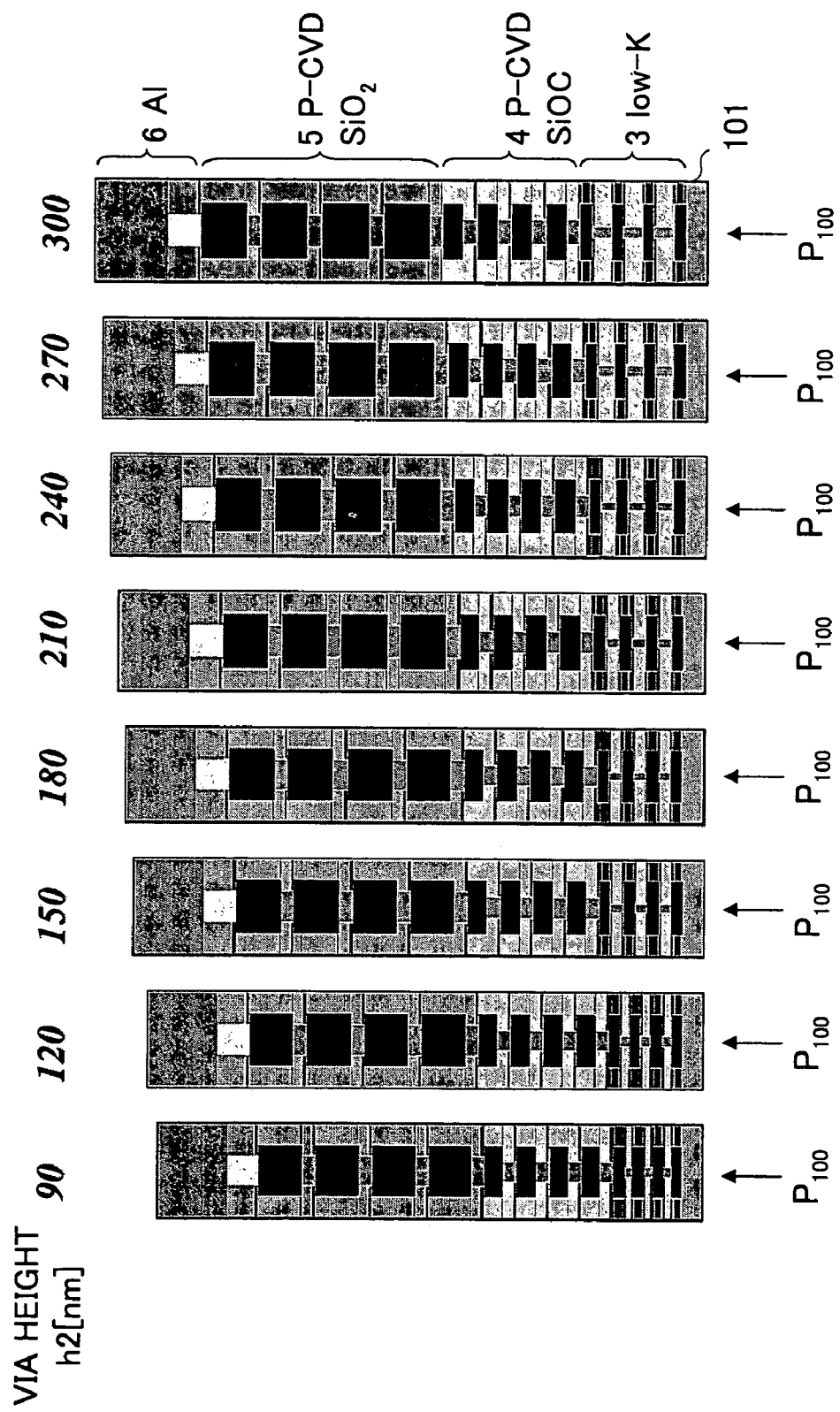
FIG. 16 is a diagram showing the entirety of the multilayer interconnection structure having the construction of FIG. 15 together with a comparative example.

FIG. 16 shows the structure of the specimen that the inventor of the present invention has used in the present embodiment.

Referring to FIG. 16, the specimen is formed on the Si substrate 101 similarly to the case of FIG. 5 and includes: a low-dielectric lower multilayer interconnection structure part 3 (Low-K), in which the interconnection layer of the construction of FIG. 15 is stacked in four layers and thus including therein the interlayer insulation films corresponding to the layers 104-107 of FIG. 5; an intermediate multilayer interconnection structure part 4 (P-CVD-SiOC) formed on the lower multilayer interconnection structure part 3 by stacking a plasma CVD-SiOC film in four layers in correspondence to the layers 108-110 of FIG. 5; and an upper multilayer interconnection structure part 5 formed on the intermediate multilayer interconnection structure part 4 by stacking a plasma CVD-SiO$_2$ film in four layers. Further, an Al electrode pad 6 is formed on the upper multilayer interconnection structure part 5.

In the structure of FIG. 16, it should be noted that there extends a pillar P1 similar to the pillar P100 explained previously with reference to FIG. 5 from the Al electrode pad 6 to the surface of the Si substrate 101 through the low-dielectric lower multilayer interconnection structure part 3, the intermediate multilayer interconnection structure part 4 and the upper multilayer interconnection structure part 5.

In the experiment of FIG. 16, it should be noted that the interconnection patterns and the via-plugs within the lower multilayer interconnection structure part 3, the intermediate multilayer interconnection structure part 4 and the upper multilayer interconnection structure part 5, are all formed of Cu, and that, in the intermediate multilayer interconnection structure part 4, each of the SiOC interlayer insulation films, including the via-layer, is formed to have a film thickness of 700 nm (400 nm for the interconnection layer, 300 nm for the via layer).

Further, in the upper multilayer interconnection structure part 5, each of the SiO$_2$ interlayer insulation films is formed to have a film thickness of 1200 nm including the via-layer (900 nm for the interconnection layer, 300 nm for the via-layer).

As explained before, the stress distribution is obtained in the above experiment for the case in which a stress corresponding to the wire bonding process is applied to the Al electrode pad, by setting the film thickness h1 of each low dielectric interlayer insulation film 1 of SILK (trade mark) in the low-dielectric lower multilayer interconnection structure part 3 to 200 nm, while changing the film thickness h2 of the via-layer 2 of SiOC to 90 nm, 120 nm, 150 nm, 180 nm, 210 nm, 240 nm, 270 nm, and 300 nm.

Figure 17:
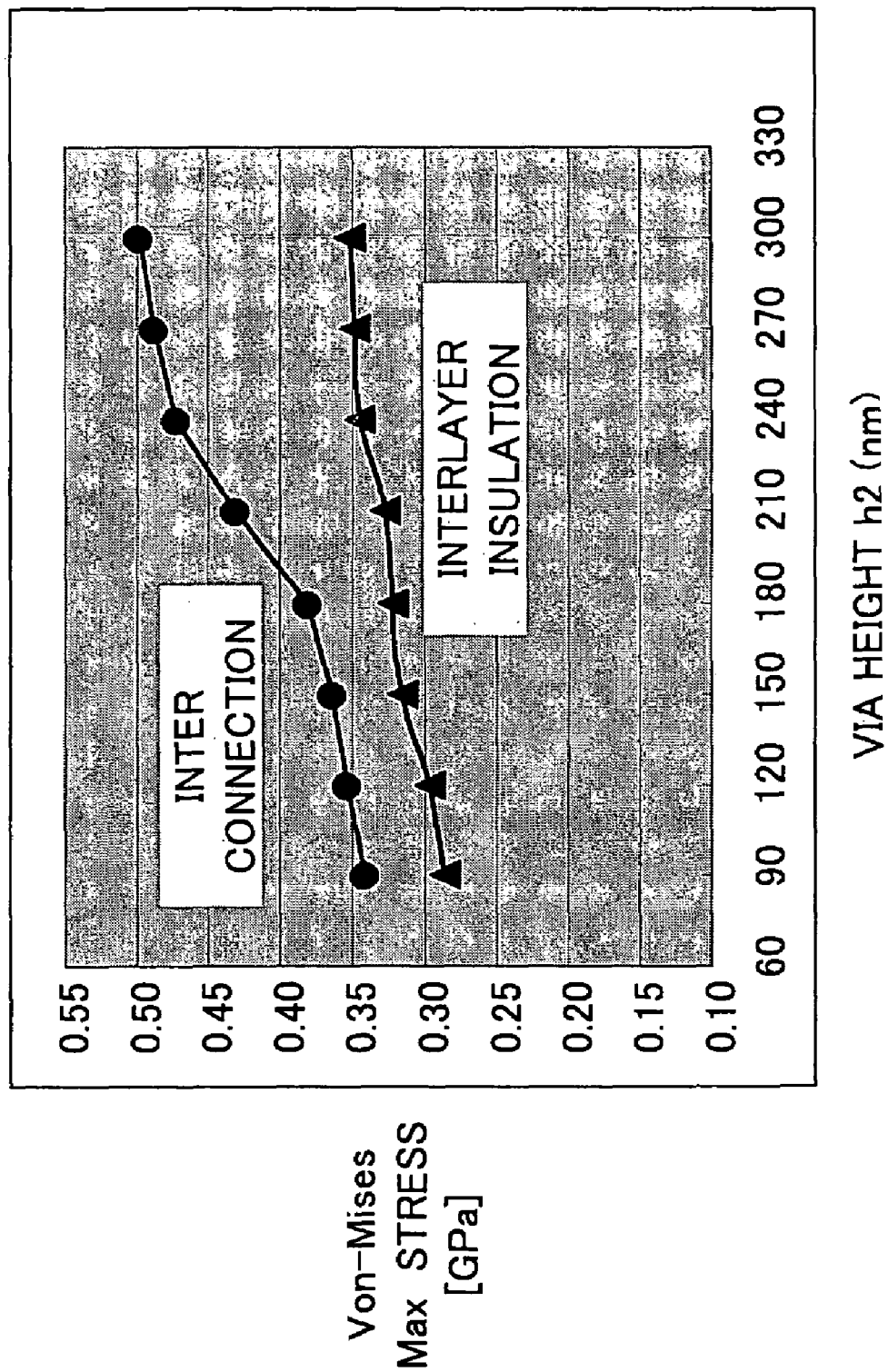
FIG. 17 is a diagram showing a stress distribution in the multilayer interconnection structure of FIG. 15.

FIG. 17 shows the stress distribution thus obtained for the low dielectric multilayer interconnection structure 3.

In the drawing, it should be noted that ● represents the stress applied to the Cu interconnection pattern 1A, while ▲ represents the stress applied to the interlayer insulation film 1.

Referring to FIG. 17, it can be seen that the stress applied to the interconnection pattern starts to increase sharply when the film thickness h2 of the via-layer 2 has exceeded about 200 nm, in other words, the thickness of interlayer insulation film 1. On the other hand, no such a critical change of the stress distribution is observed for the stress applied to the interlayer insulation film.

From FIG. 17 it can be seen that, in the semiconductor device or semiconductor integrated circuit of the construction in which a conventional multilayer interconnection structure having a large mechanical strength is stacked on a low dielectric multilayer interconnection structure as shown in FIG. 16, it is desirable to set the film thickness h2 of the SiOC film 2, which constitutes the via-layer in the construction of FIG. 15, to be equal to or smaller than the film thickness h1 of the interlayer insulation film 1, for minimizing the stress applied to the very minute interconnection patterns in the low dielectric multilayer interconnection structure.

On the other hand, in the case the film thickness h2 of the via-layer 2 is set too small in the construction of FIG. 15, and the like, the separation between the upper interconnection layer 1A and the lower interconnection layer 1A becomes too small and there arises a problem that parasitic capacitance is formed between the upper and lower interconnection layers 1A. Thus, from the viewpoint of reducing the parasitic capacitance, it is desirable to set the film thickness h2 as large as possible.

In consideration of these, it is preferable to set the film thickness h2 to about 200 nm where the sharp increase of stress is caused in the interconnection pattern 1A. Further, the film thickness of the interlayer insulation film h1 is preferably set to about 300 nm or less.

SEVENTH EMBODIMENT

Figure 18:
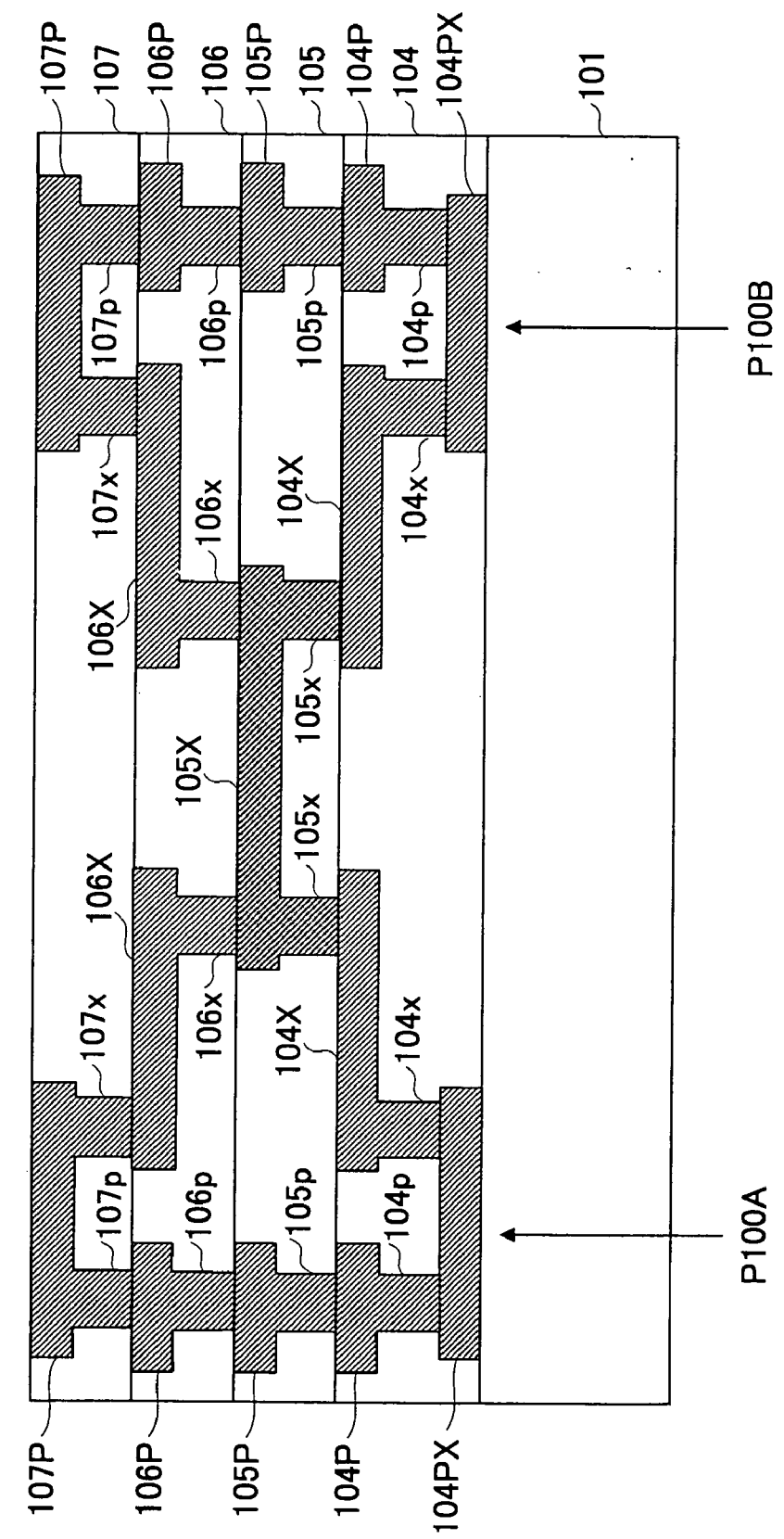
FIG. 18 is a diagram showing the construction of a multilayer interconnection structure according to a seventh embodiment of the present invention.

FIG. 18 shows a part of the semiconductor integrated circuit according to a seventh embodiment of the present invention, wherein those parts explained previously are designated by the same reference numerals and the description thereof will be omitted.

Referring to FIG. 18, the present embodiment forms, in place of the pillar P100 explained with the embodiment of FIG. 5, two pillars P100A and P100B having a similar construction on the Si substrate 101, and further forms: a Cu pattern 104X and a Cu plug 104x in the interlayer insulation film 104 in correspondence to the Cu pattern 104P and the Cu plug 104p between the pillars P100A and P100B; a Cu pattern 105X and a Cu plug 105x in the interlayer insulation film 105 in correspondence to the Cu pattern 105P and the Cu plug 105p; a Cu pattern 106X and a Cu plug 106x in the interlayer insulation film 106 in correspondence to the Cu pattern 106P and the Cu plug 106p; and a Cu pattern 107X and a Cu plug 107x in the interlayer insulation film 107 in correspondence to the Cu pattern 107P and the Cu plug 107p, such that there is formed an X-shaped reinforcement structure as a whole.

In the example of FIG. 18, a Cu base pattern 104PX is formed at the base part of the pillars P100A and P100B, and the Cu plug 104p of the lowermost part is formed so as to make a contact on the Cu base pattern 104P.

FIGS. 19A-19D show the result of simulation of the stress distribution caused in the structure of FIG. 18 for the case in which a stress of 0.07 MPa is applied to the multilayer interconnection structure in which such an X-shaped reinforcement structure is formed in the direction parallel to the substrate surface.

In FIGS. 19A-19D, the simulation has been conducted on a model in which an intermediate multilayer interconnection structure similar to the structure 4 and an upper part multilayer interconnection structure similar to the structure 5 and an Al electrode pad similar to the pad 6 explained previously with reference to FIG. 16 are formed further on the multilayer interconnection structure 600 of FIG. 18. Thereby, the simulation is conducted based on the assumption that: each of the low dielectric interlayer insulation films 104-107 has a Young modulus of 2.45 GPa and a poisson ratio of 0.25; the Cu interconnection pattern such as the pattern 104X, and the like, and the Cu plug such as the plug 104x, and the like, have a Young modulus of 127.5 GPa and a poisson ratio of 0.33; the SiOC interlayer insulation film forming the intermediate multilayer interconnection structure 5 in FIG. 16 has a Young modulus of 20 GPa and a poisson ratio of 0.25; the SiO$_2$ interlayer insulation film (USG) forming the upper multilayer interconnection structure part 6 has a Young modulus of 70 GPa and a poisson ratio of 0.17; and that the Al electrode pad 6 has a Young modulus of 70 GPa and a poisson ratio of 0.35. It should be noted that the stress of 0.07 MPa generally corresponds to the stress applied at the time of a CMP process.

Referring to FIGS. 19A-19D, FIG. 19A shows the case in which the X-shaped structure is formed while FIG. 19B shows a part of FIG. 19A with an enlarged scale. It can be seen that there is caused no conspicuous stress concentration in the pillars P100A and P100B even in the case a stress acting parallel to the substrate surface is applied.

On the other hand, FIG. 19C shows the stress distribution for the case no such an X-shaped reinforcement structure is provided, while FIG. 19D shows a part of FIG. 19C in an enlarged scale.

In this case, it can be seen that there is caused conspicuous stress concentration in the root part of the pillars P100A and P100B.

Thus, it is possible to improve the endurance of the multilayer interconnection structure to the stress acting parallel to the substrate surface by providing the X-shaped reinforcement structure as shown in FIG. 18.

It should be noted that the stress acting parallel to the substrate can be caused not only at the time of the CMP process but also at the time of molding process, dicing process or at the time of the bonding process conducted by using ultrasonic energy.

Further, such an X-shaped reinforcement structure is applicable also to the guard ring explained with reference to FIG. 14.

Figure 20:
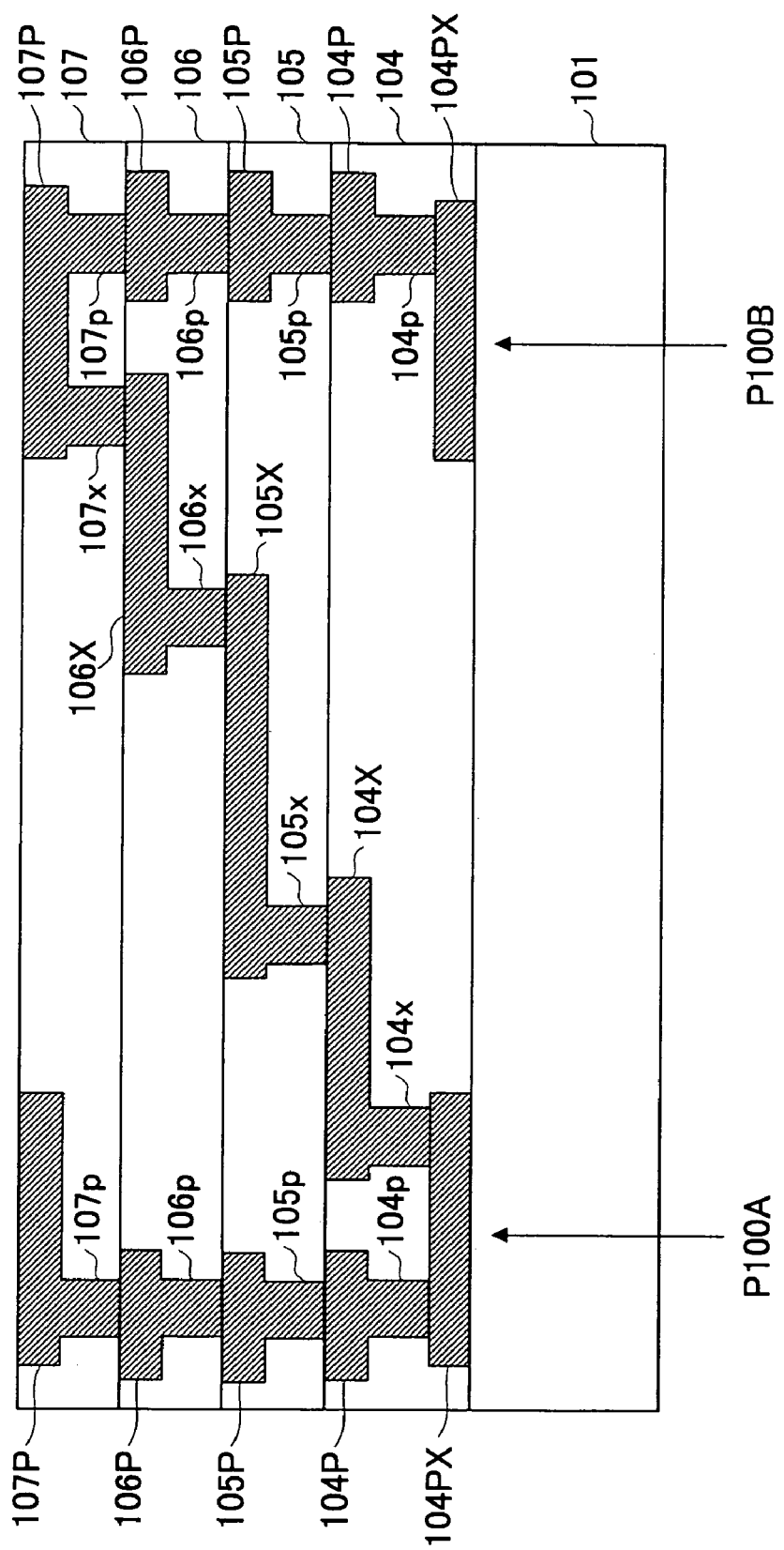
FIG. 20 is a diagram-showing a modification of the multilayer interconnection structure of FIG. 18.

Also, it is possible to form a reinforcement structure only in one of the diagonal lines by simplifying the construction of FIG. 18 as shown in FIG. 20. In such a structure, the region usable for formation of the interconnection patterns is increased. Other aspects of FIG. 20 are the same as those explained previously and the description thereof will be omitted.

Figure 21:
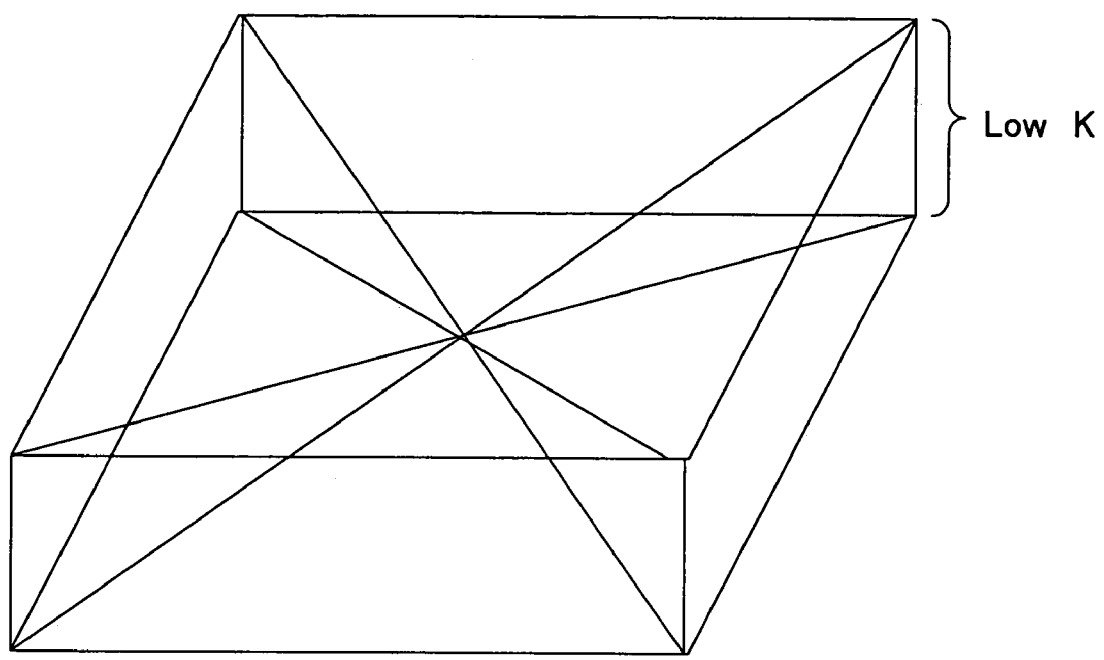
FIG. 21 is a diagram showing another modification of the multilayer interconnection structure of FIG. 18.

Further, as shown in FIG. 21, such a diagonal reinforcement structure can be formed in the form of three-dimension diagonal lines in the low dielectric multilayer structure as shown in FIG. 21.

Further, the present invention is not limited to the specific embodiments described heretofore, but various modifications or variations can be possible within the scope of the invention.

What is claimed is:

1. A semiconductor device, comprising:
   a substrate;
   a first multilayer interconnection structure formed over said substrate; and
   a second multilayer interconnection structure formed over said first multilayer interconnection structure,
   wherein said first multilayer interconnection structure includes a first interlayer insulation film and a first interconnection layer included in said first interlayer insulation film;
   said second multilayer interconnection structure includes a second interlayer insulation film and a second interconnection layer included in said second interlayer insulation film,
   said first multilayer interconnection structure including a pillar vertically extending straight from a surface of said substrate and reaching at least said second multilayer interconnection structure, said pillar being formed in a region of said substrate right underneath an electrode pad so as to support stress during wire bonding,
   said first interconnection layer being formed so as to avoid said pillar, and
   said pillar being provided on a device isolation structure on said substrate,
   wherein said first interlayer insulation film has a first Young modulus and said second interlayer insulation film has a second, larger Young modulus than said first Young modulus.

2. The semiconductor device as claimed in claim 1, wherein said pillar has a layered structure identical to a layered structure of said first interconnection layer in said first multilayer interconnection structure.

3. The semiconductor device as claimed in claim 1, wherein said pillar has an edge part engaging to a bottom surface of said second multilayer interconnection structure.

4. The semiconductor device as claimed in claim 1, wherein said pillar extends further in said second multilayer interconnection structure and has a layered structure identical to a layered structure of said second interconnection layer in a part thereof extending in said second multilayer interconnection structure.

5. The semiconductor device as claimed in claim 1, wherein an electrode pad is formed on said second multilayer interconnection structure.

6. The semiconductor device as claimed in claim 5, wherein said pillar is formed in plural numbers so as to occupy at least 15% of the area of said region of said substrate right underneath said electrode pad as a whole.

7. The semiconductor device as claimed in claim 5, wherein there is formed an active device in a region of said substrate right underneath said electrode pad.

8. The semiconductor device as claimed in claim 1, wherein said first Young modulus has a value less than 30 GPa and said second Young modulus has a value equal to or larger than 30 GPa.

9. The semiconductor device as claimed in claim 1, wherein said first Young modulus has a value ½ or less of said second Young modulus.

10. The semiconductor device as claimed in claim 1, wherein said pillar has a Young modulus of 30 GPa or more.

11. The semiconductor device as claimed in claim 1, wherein, in said first multilayer interconnection structure, said pillar is formed with plural numbers so as to be located at both sides of an interconnection pattern forming a part of said first interconnection layer.

12. The semiconductor device as claimed in claim 1, wherein said pillar forms a wall extending continuously on said surface of said substrate.

13. The semiconductor device as claimed in claim 1, wherein said pillar extends continuously along a circumference of said substrate in said first and second multilayer interconnection structures and form a guard ring.

14. The semiconductor device as claimed in claim 1, wherein said first interlayer insulation film is formed of a porous film.

15. The semiconductor device as claimed in claim 1, wherein said first interlayer insulation film is an organic film.

16. The semiconductor device as claimed in claim 1, wherein said second interlayer insulation film is a CVD insulation film.

17. The semiconductor device as claimed in claim 1, wherein said pillar is provided in plural number on said substrate, and wherein there is formed a reinforcement structure in said first multilayer interconnection structure so as to extend diagonally between said plural pillars.

18. The semiconductor device as claimed in claim 1, wherein said pillar is formed of a plurality of segments aligned straight from said device isolation structure to said contact pad.

19. The semiconductor device as claimed in claim 1, wherein said pillar engages with a bottom surface of said contact pad via a plug formed in a passivation film.

* * * * *